(12) United States Patent
McGeehan et al.

(10) Patent No.: US 11,127,716 B2
(45) Date of Patent: Sep. 21, 2021

(54) MOUNTING STRUCTURES FOR INTEGRATED DEVICE PACKAGES

(71) Applicant: Analog Devices International Unlimited Company, Limerick (IE)

(72) Inventors: Rigan McGeehan, Limerick (IE); Cillian Burke, Limerick (IE); Alan J. O'Donnell, Castletroy (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/366,476

(22) Filed: Mar. 27, 2019

(65) Prior Publication Data
US 2019/0319011 A1 Oct. 17, 2019

Related U.S. Application Data

(60) Provisional application No. 62/656,840, filed on Apr. 12, 2018.

(51) Int. Cl.
*H01L 25/065* (2006.01)
*H01L 21/304* (2006.01)
(Continued)

(52) U.S. Cl.
CPC ........ *H01L 25/0657* (2013.01); *H01L 21/304* (2013.01); *H01L 21/78* (2013.01);
(Continued)

(58) Field of Classification Search
CPC ............. H01L 23/12–15; H01L 23/473; H01L 23/467; H01L 25/04–0756;
(Continued)

(56) References Cited

U.S. PATENT DOCUMENTS 4,739,443 A * 4/1988 Singhdeo ................ H01L 23/15
361/689
5,627,407 A 5/1997 Suhir et al.
(Continued)

FOREIGN PATENT DOCUMENTS

CN 103253627 A 8/2013
JP H02-78234 3/1990
(Continued)

OTHER PUBLICATIONS

Extended European Search Report issued in application No. 19168428.1 dated Dec. 19, 2019.
(Continued)

*Primary Examiner* — Sonya McCall-Shepard
(74) *Attorney, Agent, or Firm* — Knobbe, Martens, Olson & Bear, LLP

(57) ABSTRACT

An integrated device package is disclosed. The package can include a carrier and an integrated device die having a front side and a back side. A mounting structure can serve to mount the back side of the integrated device die to the carrier. The mounting structure can comprise a first layer over the carrier and a second element between the back side of the integrated device die and the first layer. The first layer can comprise a first insulating material that adheres to the carrier, and the second element can comprise a second insulating material.

20 Claims, 21 Drawing Sheets

(51) Int. Cl.
*H01L 21/78* (2006.01)
*H01L 23/00* (2006.01)
*H01L 25/00* (2006.01)
*B81B 7/00* (2006.01)
*H01L 23/495* (2006.01)
*H01L 23/538* (2006.01)

(52) U.S. Cl.
CPC .............. *H01L 24/50* (2013.01); *H01L 24/73* (2013.01); *H01L 25/50* (2013.01); *H01L 2224/73229* (2013.01); *H01L 2225/0651* (2013.01); *H01L 2225/06579* (2013.01); *H01L 2225/06582* (2013.01); *H01L 2225/06589* (2013.01)

(58) Field of Classification Search
CPC ... H01L 2225/0651; H01L 2225/06558; H01L 2225/06572; H01L 2225/06575; H01L 2225/06579; H01L 2225/06582; H01L 23/5383; H01L 23/0652; H01L 23/4951; H01L 23/49513
See application file for complete search history.

(56) References Cited

U.S. PATENT DOCUMENTS

| | | | |
|---|---|---|---|
| 5,834,848 A | 11/1998 | Iwasaki | |
| 6,005,778 A * | 12/1999 | Spielberger | H01L 25/0657 361/770 |
| 6,084,308 A | 7/2000 | Kelkar et al. | |
| 6,166,434 A | 12/2000 | Desai et al. | |
| 6,184,064 B1 | 2/2001 | Jiang et al. | |
| 6,689,640 B1 | 2/2004 | Mostafazadeh | |
| 6,768,196 B2 | 7/2004 | Harney | |
| 7,022,546 B2 | 4/2006 | Spooner et al. | |
| 7,053,476 B2 | 5/2006 | Karnezos | |
| 7,166,911 B2 | 1/2007 | Karpman | |
| 7,227,245 B1 | 6/2007 | Bayan et al. | |
| 7,586,178 B2 | 9/2009 | Manatad | |
| 7,615,853 B2 | 11/2009 | Shen et al. | |
| 7,675,180 B1 | 3/2010 | St. Amand et al. | |
| 7,795,725 B2 | 9/2010 | Mouli et al. | |
| 7,893,546 B2 | 2/2011 | Zhao et al. | |
| 7,906,855 B1 | 3/2011 | Kim et al. | |
| 7,939,916 B2 | 5/2011 | O'Donnell et al. | |
| 8,072,083 B1 | 12/2011 | St. Amand et al. | |
| 8,143,727 B2 | 3/2012 | Oh et al. | |
| 8,324,729 B2 | 12/2012 | Gupta et al. | |
| 8,338,938 B2 | 12/2012 | Hsu et al. | |
| 8,344,487 B2 | 1/2013 | Zhang et al. | |
| 8,432,043 B2 | 4/2013 | Takiar et al. | |
| 8,558,365 B1 | 10/2013 | Roa et al. | |
| 8,569,861 B2 | 10/2013 | O'Donnell et al. | |
| 8,704,364 B2 | 4/2014 | Banijamali | |
| 8,729,710 B1 | 5/2014 | Kim et al. | |
| 8,779,532 B2 | 7/2014 | O'Donnell et al. | |
| 9,041,150 B2 | 5/2015 | O'Donnell et al. | |
| 9,343,367 B2 | 5/2016 | Goida et al. | |
| 9,583,476 B2 | 2/2017 | Ye et al. | |
| 9,640,458 B2 | 5/2017 | Ye et al. | |
| 9,698,127 B2 | 7/2017 | Goida et al. | |
| 9,773,740 B2 | 9/2017 | Saxod et al. | |
| 9,953,933 B1 | 4/2018 | Cadag et al. | |
| 10,254,476 B1 | 4/2019 | Dutta | |
| 10,256,193 B1 | 4/2019 | Golab et al. | |
| 10,287,161 B2 | 5/2019 | Xue et al. | |
| 2002/0096755 A1 | 7/2002 | Fukui et al. | |
| 2002/0125550 A1 | 9/2002 | Estacio | |
| 2003/0025183 A1 | 2/2003 | Thornton et al. | |
| 2003/0025199 A1 | 2/2003 | Wu et al. | |
| 2004/0041248 A1 | 3/2004 | Harney et al. | |
| 2005/0093174 A1 | 5/2005 | Seng | |
| 2005/0112842 A1 | 5/2005 | Kang et al. | |
| 2005/0280141 A1 | 12/2005 | Zhang | |
| 2006/0202319 A1 | 9/2006 | Swee Seng | |
| 2006/0249830 A1 | 11/2006 | Shim et al. | |
| 2007/0075404 A1 | 4/2007 | Dimaano | |
| 2007/0152314 A1 | 7/2007 | Manepalli et al. | |
| 2007/0205792 A1 | 9/2007 | Mouli et al. | |
| 2007/0215992 A1 * | 9/2007 | Shen | H01L 24/83 257/668 |
| 2008/0128879 A1 | 6/2008 | Takiar et al. | |
| 2008/0203566 A1 | 8/2008 | Su | |
| 2008/0217761 A1 | 9/2008 | Yang et al. | |
| 2009/0014893 A1 | 1/2009 | Abela | |
| 2009/0147479 A1 | 6/2009 | Mori | |
| 2009/0200065 A1 | 8/2009 | Otoshi | |
| 2009/0289265 A1 | 11/2009 | Roozeboom et al. | |
| 2011/0074037 A1 | 3/2011 | Takeshima et al. | |
| 2011/0316158 A1 | 12/2011 | Chin et al. | |
| 2012/0080764 A1 | 4/2012 | Xue | |
| 2012/0098121 A1 | 4/2012 | Chen | |
| 2014/0091461 A1 | 4/2014 | Shen | |
| 2014/0103501 A1 | 4/2014 | Chen et al. | |
| 2014/0197042 A1 | 7/2014 | Zhang et al. | |
| 2015/0162366 A1 * | 6/2015 | Oganesian | H01L 23/13 257/433 |
| 2016/0181169 A1 | 6/2016 | Huang et al. | |
| 2019/0051605 A1 * | 2/2019 | Horibe | H01L 21/6835 |

FOREIGN PATENT DOCUMENTS

| | | |
|---|---|---|
| JP | H07-302772 | 11/1995 |
| JP | H 08-288455 | 11/1996 |
| JP | 2001-308262 | 11/2001 |
| JP | 2002-134439 | 5/2002 |
| JP | 2002-222913 | 8/2002 |
| JP | 2004-072009 | 3/2004 |
| JP | 2007-053240 | 3/2007 |
| JP | 2012-164970 | 8/2012 |
| KR | 10-2002-0062857 | 7/2002 |
| WO | WO 2008/091840 A2 | 7/2008 |
| WO | WO 2010/039855 A2 | 4/2010 |

OTHER PUBLICATIONS

Partial European Search Report issued in application No. 19168428.1 dated Aug. 22, 2019.

Extended European Search Report dated Dec. 11, 2015, issued in EP Application No. 14199059.8, in 10 pages.

Chinese Office Action dated Apr. 20, 2018, in CN Appl. No. 201610584236.3, in 10 pages.

Nie et al., "An integrated flex-microfluidic-Si chip device towards sweat sensing applications", Sensors and Actuators B: Chemical, 227: 427-437 (2016).

Zevenbergen et al., "Solid state pH and chloride sensor with microfluidic reference electrode", IEEE International Electron Devices Meeting (IEDM), pp. 26.1.1-26.1.4 (2016).

Office Action issued in Japanese application No. 2019-076342 dated Aug. 24, 2020.

* cited by examiner

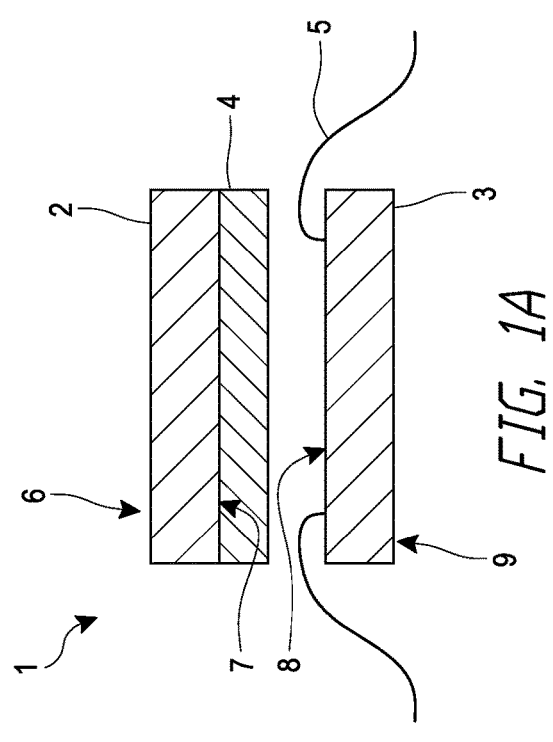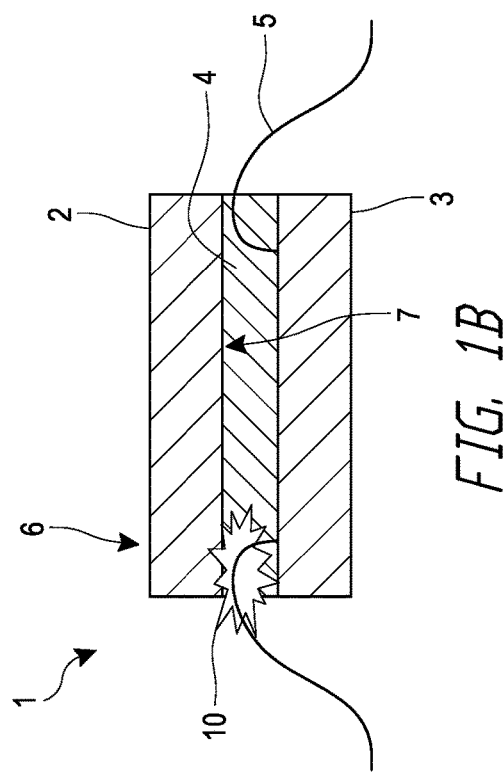
FIG. 1A
FIG. 1B

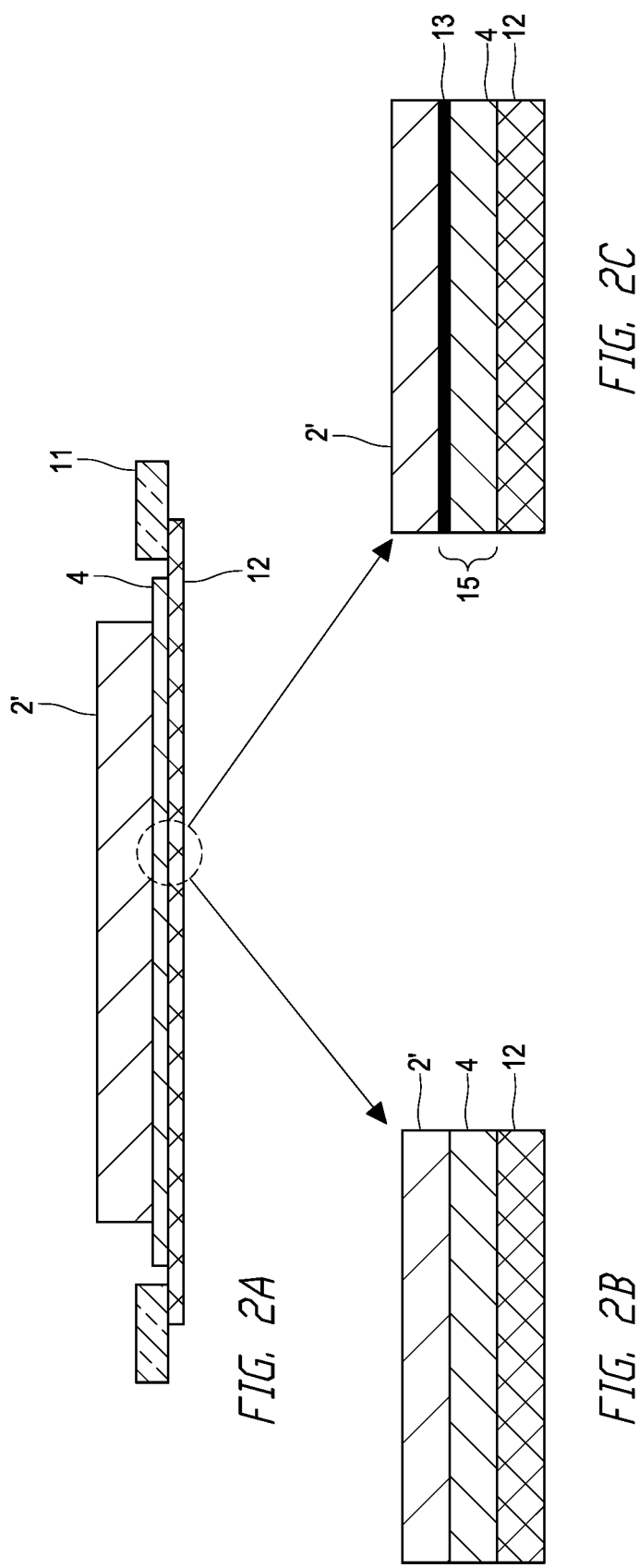

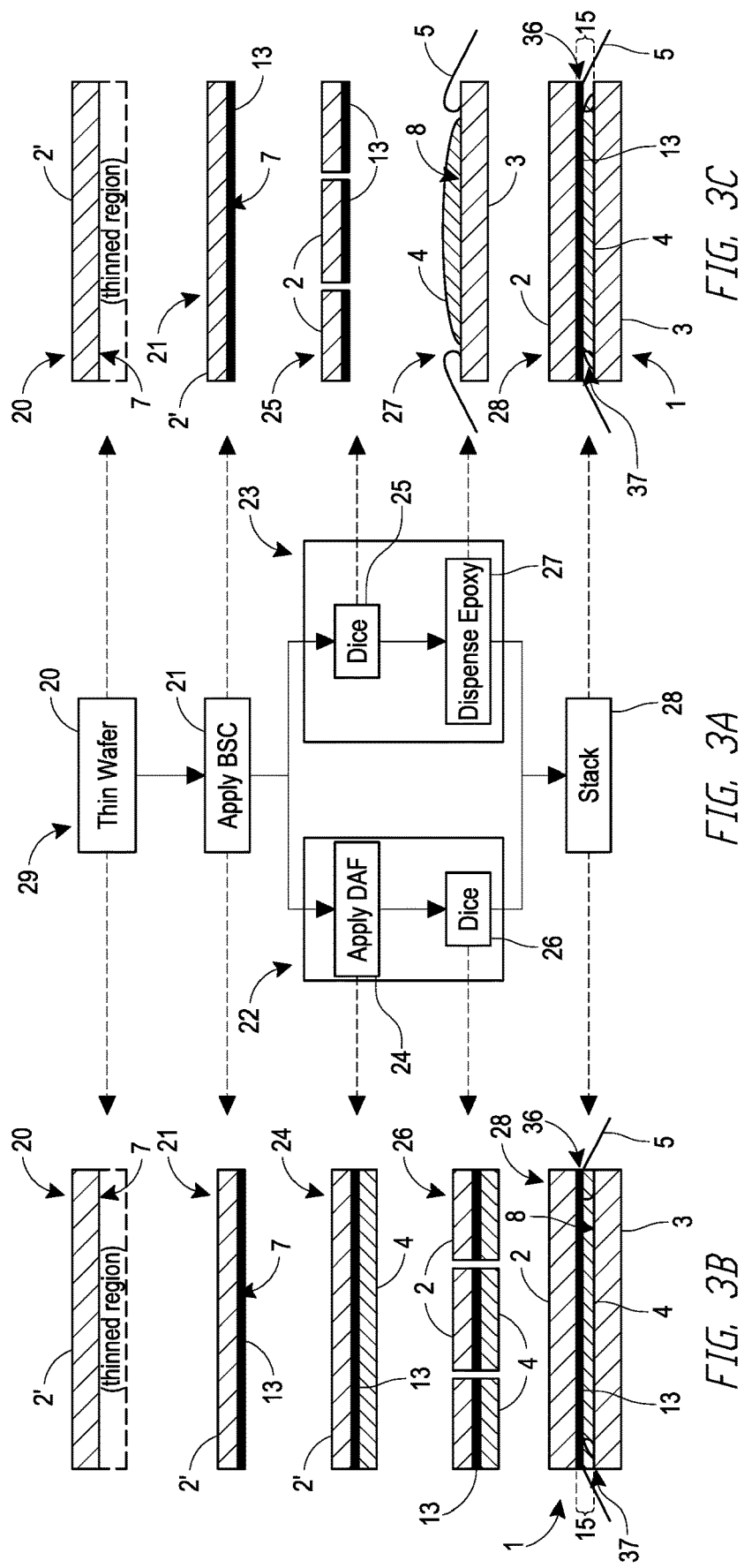

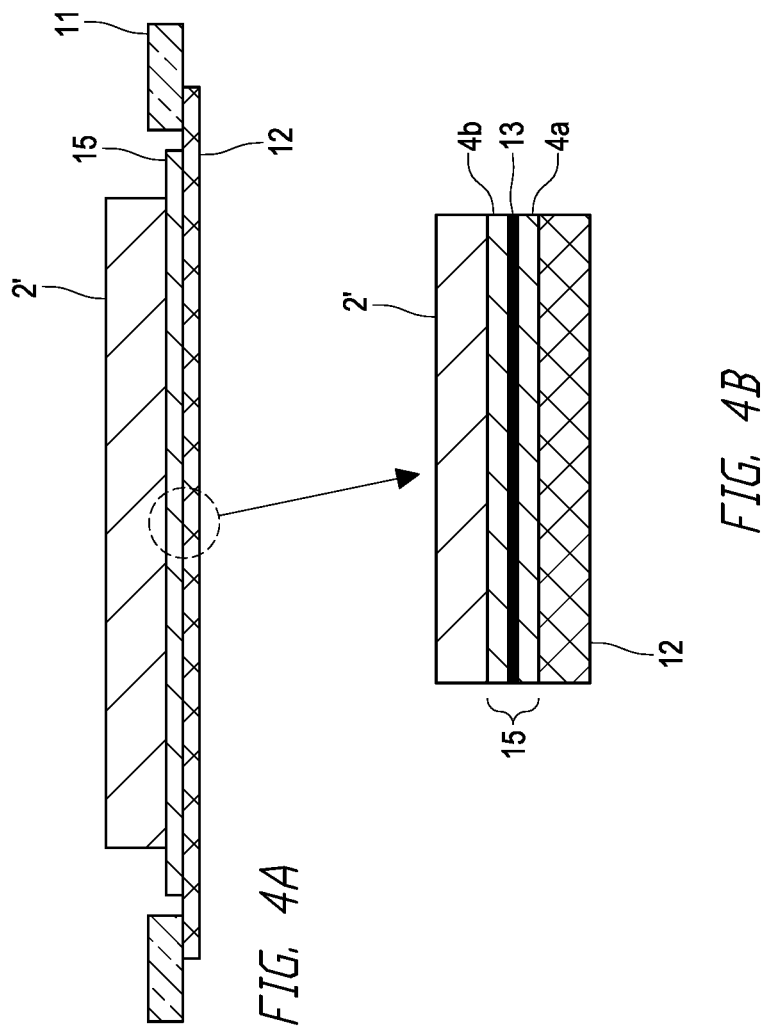

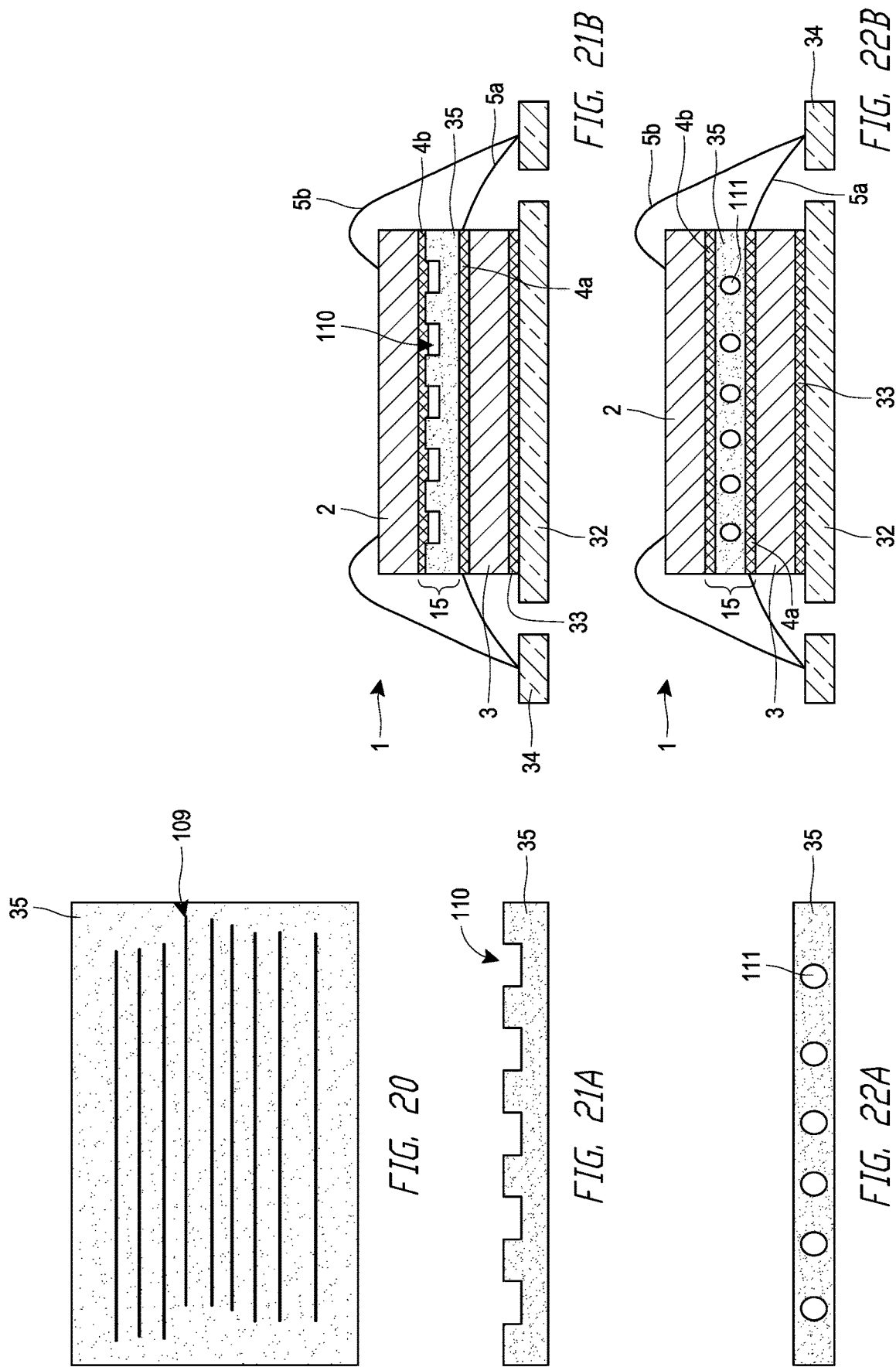

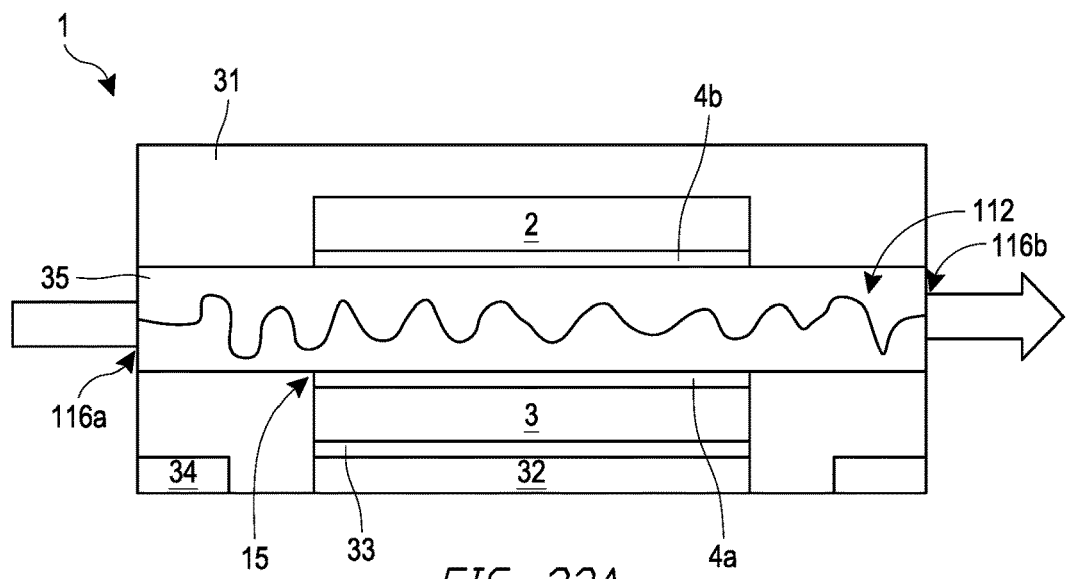
FIG. 23A
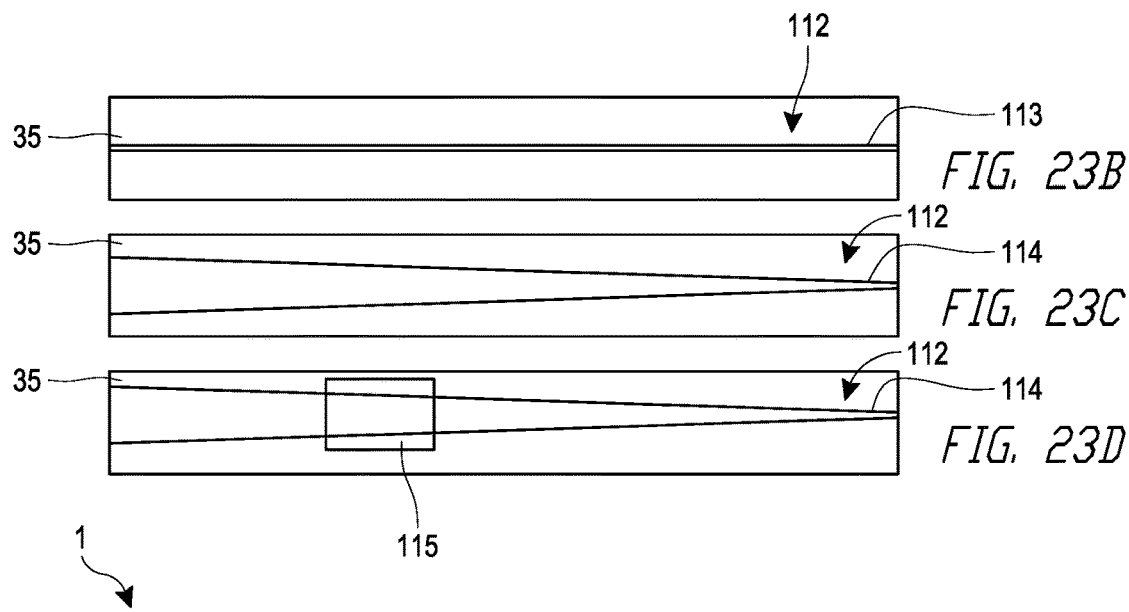
FIG. 23B
FIG. 23C
FIG. 23D
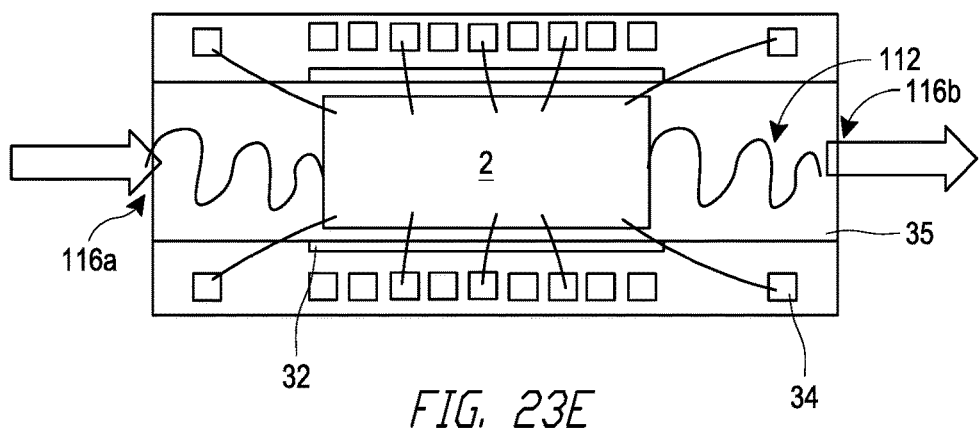
FIG. 23E

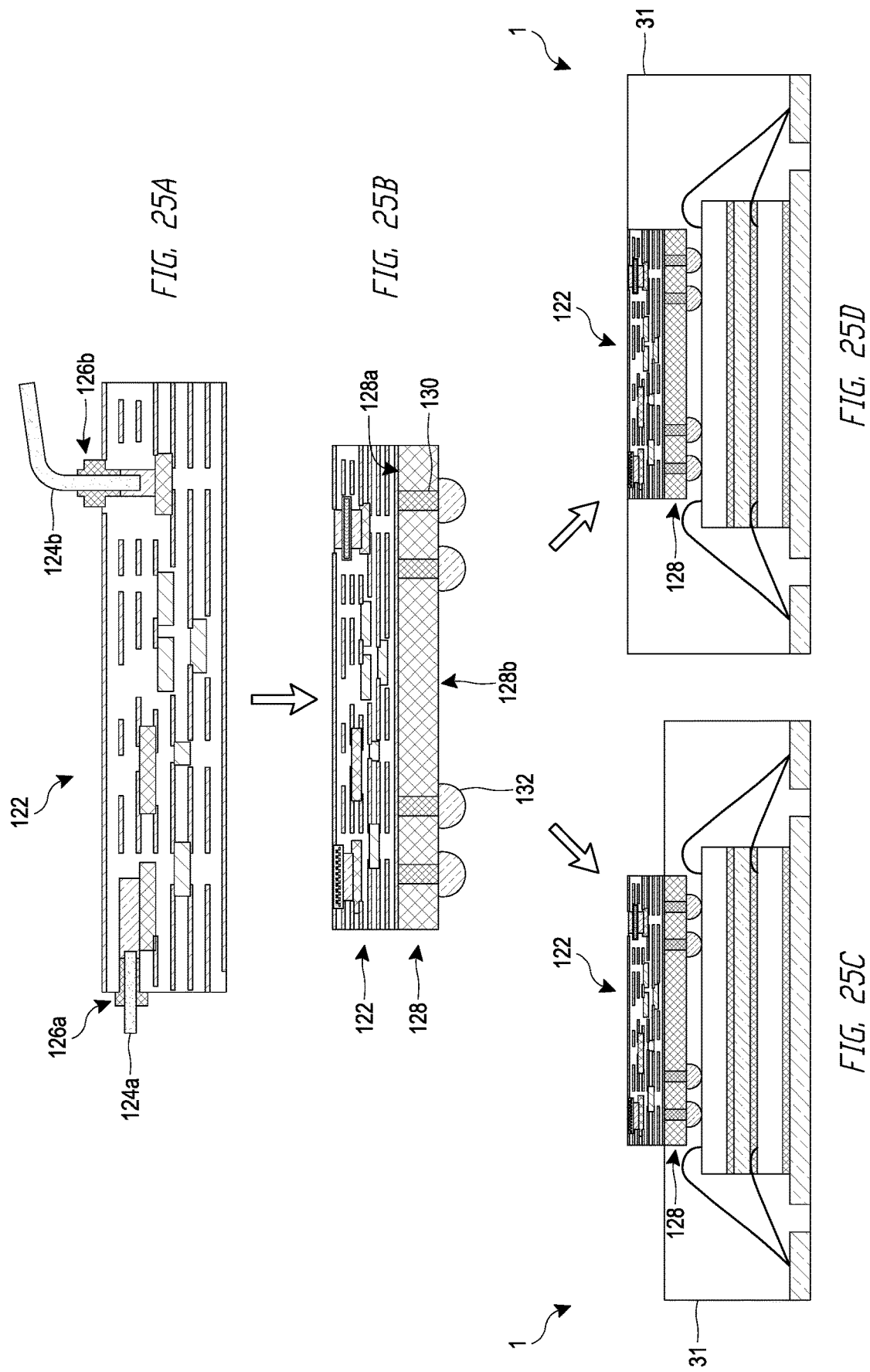

MOUNTING STRUCTURES FOR INTEGRATED DEVICE PACKAGES

CROSS-REFERENCE TO RELATED APPLICATIONS

This application claims priority to U.S. Provisional Patent Application No. 62/656,840, titled "MOUNTING STRUCTURES FOR INTEGRATED DEVICE PACKAGES," filed Apr. 12, 2018, the entire contents of which are hereby incorporated by reference herein in their entirety and for all purposes.

BACKGROUND

Field

The field relates to mounting structures (e.g., mounting films or tapes) for integrated device packages.

Description of the Related Art

Various types of integrated device packages include an integrated device die mounted to a carrier, which may comprise a second integrated device die. Stacking the integrated device die on the carrier may introduce stresses on the carrier, or vice versa. Furthermore, in some packages, the carrier (e.g., an integrated device die) can be wire bonded to another structure, such as a package substrate. In such packages, it can be challenging to provide adequate electrical isolation between portions of the carrier and portions of the integrated device die. Furthermore, stacking the integrated device die on the carrier may induce stresses in the carrier and/or in the die. Accordingly, there remains a continuing need for improved integrated device packages that include a die stacked or mounted on a carrier.

SUMMARY

In one aspect, an integrated device package is disclosed. The integrated device package (or "package") can comprise a carrier and an integrated device die having a front side and a back side. A mounting structure can serve to mount the back side of the integrated device die to the carrier. The mounting structure can comprise a first adhesive layer over the carrier and a second element between the back side of the integrated device die and the first adhesive layer. The first adhesive layer can comprise a first insulating material that adheres to the carrier. The second element can comprise a second insulating material that electrically separates the integrated device die from the carrier and/or from an electrical interconnect connected to the carrier.

In one embodiment, the first insulating material has a first flowable state and a second hardened state.

In one embodiment, the carrier comprises a package substrate. The package substrate can comprise a leadframe substrate or a laminate substrate.

In one embodiment, the first layer comprises a die attach film (DAF) or an epoxy paste. The first layer can comprises an epoxy paste.

In one embodiment, the second element comprises a solid coating that is applied over the back side of the integrated device die.

In one embodiment, the second element comprises a spacer that is attached to the first layer. The spacer can include a pathway to provide at least one of electrical, optical, and fluidic communication between an input terminal and an output terminal of the spacer. The pathway can extend vertically through the spacer to provide communication between the carrier and the integrated device die. The pathway can include a fiber optic channel. The integrated device package can further include a second spacer over the integrated device die. The second spacer can include a second pathway. The second pathway can provide communication between the integrated device die and the outside environs.

In one embodiment, a coefficient of thermal expansion (CTE) of the spacer is within at least +/−90% of one or more of a coefficient of expansion of the integrated device die and a coefficient of thermal expansion of the carrier.

In one embodiment, a first exposed sidewall of the first layer defines a first profile, and second exposed sidewall of the second element defines a second profile. The first profile comprises a curved or non-linear surface and the second profile comprises a generally planar surface.

In one embodiment, the mounting structure comprises a third layer between the back side of the integrated device die and the second element such that the second element is embedded between the first layer and the third layer. The third layer can comprise a third insulating material.

In one embodiment, one or both of the first layer and the second element comprises a polymer.

In one embodiment, the integrated device die is laterally smaller than the mounting structure.

In one aspect, multi-layer mounting tape for attaching an integrated device die to a carrier and electrically isolating a back side of the integrated device die from the carrier is disclosed. The multi-layer mounting tape can comprise a first layer comprising a first insulating material having a first flowable state and a second hardened state. The multi-layer mounting tape can comprise a second layer over the first layer, the second layer comprising a second insulating material. The multi-layer mounting tape can comprise a third layer over the second layer, such that the second layer is embedded between the first layer and the third layer, the third layer comprising a third insulating material, the third insulating material having a first flowable state and a second hardened state.

In one embodiment, the first and third layers each comprise a die attach film (DAF).

In one embodiment, the second layer comprises a thermoset polymer.

In one aspect, a method of manufacturing an integrated device package is disclosed. The method can include mounting a back side of an integrated device die to a carrier by way of a multi-layer mounting structure, the multi-layer mounting structure comprising a first layer over the carrier and a second element over the first layer. The first layer can comprise a first insulating material that adheres to the carrier. The second element can comprise a second insulating material that electrically separates the integrated device die from the carrier and/or from an electrical interconnect connected to the carrier.

In one embodiment, the second element comprises a second layer. The method can further include applying the second layer to the back side of a wafer that comprises a plurality of device regions. After the applying, dicing the wafer into a plurality of integrated device dies. The plurality of integrated device dies comprises the integrated device die.

In one embodiment, the method further includes before the mounting, applying the first layer to a bottom surface of the second layer.

In one embodiment, the method further includes, before the mounting, applying the first layer to a top surface of the carrier.

In one embodiment, the carrier comprises a second integrated device die wire bonded to a package substrate by a bonding wire. The method further includes bringing together the integrated device die and the carrier with the multi-layer mounting structure between the integrated device die and the carrier, and causing the first layer in the first flowable state to flow around the bonding wire.

In one aspect, an integrated device package is disclosed. The integrated device package can include a carrier. The integrated device package can also include an integrated device die that has a front side and a back side. The integrated device package can further include a mounting structure that serves to mount the back side of the integrated device die to the carrier. The mounting structure includes a first adhesive layer over the carrier and a spacer between the back side of the integrated device die and the first adhesive layer. The spacer includes a pathway to provide at least one of electrical, optical, and fluidic communication between an input terminal and an output terminal of the spacer.

In one embodiment, the pathway extends vertically through the spacer to provide communication between the carrier and the integrated device die.

In one embodiment, the pathway comprises a fiber optic channel.

In one embodiment, the integrated device package further includes a second spacer over the integrated device die, the second spacer includes a second pathway, the second pathway providing communication between the integrated device die and the outside environs.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Specific implementations of the invention will now be described with reference to the following drawings, which are provided by way of example, and not limitation.

FIG. 1A is a schematic side view of an integrated device package prior to mounting an integrated device die to a carrier.

FIG. 1B is a schematic side view of an integrated device package after the integrated device die is mounted to or stacked on the carrier.

FIG. 2A is a schematic side view of a wafer temporarily mounted to a wafer mount by way of a wafer film or tape, according to various embodiments.

FIG. 2B is an enlarged schematic side view of a portion of the wafer coupled with the wafer film or tape, with the wafer film or tape comprising an insulating adhesive layer over a structural layer.

FIG. 2C is an enlarged schematic side view of a portion of the wafer coupled with the wafer by way of a mounting structure, according to some embodiments.

FIG. 3A is a flow chart illustrate a method for manufacturing an integrated device package, according to some embodiments.

FIG. 3B illustrates a series of schematic side views of the package at various stages of the method shown in FIG. 3A, according to one embodiment.

FIG. 3C illustrates a series of schematic side views of the package at various stages of the method shown in FIG. 3A, according to another embodiment.

FIG. 4A is a schematic side view of a wafer temporarily mounted to a wafer mount by way of a wafer tape, according to various other embodiments.

FIG. 4B is an enlarged schematic side view of a portion of the wafer coupled with the wafer by way of a multi-layer mounting structure, according to some embodiments.

FIG. 20 is a schematic top view of a spacer according to another embodiment.

FIG. 21A is a schematic cross sectional view of a spacer according to an embodiment.

FIG. 21B is a schematic side sectional view of an integrated device package that includes the spacer of FIG. 21A.

FIG. 22A is a schematic cross sectional view of a spacer according to another embodiment.

FIG. 22B is a schematic side sectional view of an integrated device package that includes the spacer of FIG. 22A.

FIG. 23A is a schematic side sectional view of an integrated device package according to an embodiment.

FIG. 23B is a schematic side sectional view of a spacer according to an embodiment.

FIG. 23C is a schematic side sectional view of a spacer according to another embodiment.

FIG. 23D is a schematic side sectional view of a spacer according to another embodiment.

FIG. 23E is a schematic top view of the package of FIG. 23A.

FIG. 25A illustrates a schematic side sectional view of a laminate substrate.

FIG. 25B illustrates a schematic side sectional view of the laminate substrate that is mounted on a carrier.

FIG. 25C illustrate a schematic side sectional view of an integrated device package that includes the laminate substrate and the carrier of FIG. 25B, according to an embodiment.

FIG. 25D illustrate a schematic side sectional view of an integrated device package that includes the laminate substrate and the carrier of FIG. 25B, according to another embodiment.

DETAILED DESCRIPTION

Figure 5B:
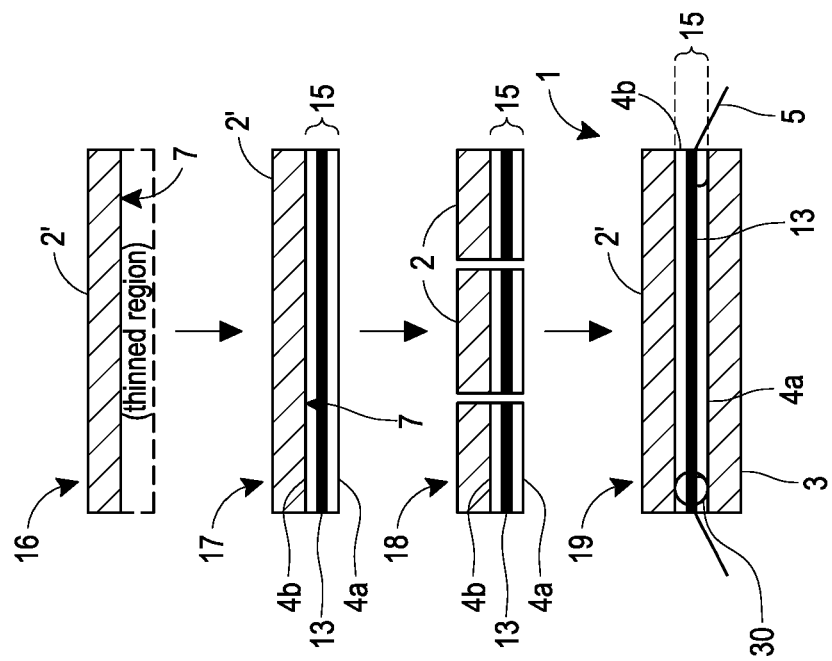
FIG. 5B illustrates a series of schematic side views of the package at various stages of the method shown in FIG. 5A, according to one embodiment.

Various embodiments disclosed herein relate to integrated device packages in which an integrated device die is stacked or mounted to a carrier. The carrier can comprise another integrated device die or any suitable packaging structure, such as a package substrate. The die can be mounted to the carrier by way of a mounting structure (such as a multi-layer mounting structure) or tape (or film) that comprises a first layer of a first insulating material and a second element (e.g. a second layer or other element) of a second insulating material, with the second element disposed between the first layer and a back side of the integrated device die. In some embodiments, the first layer can comprise a flowable die attach film (DAF) that has a flowable state and a cured or hardened state. The second element can comprise a solid insulating layer that can physically and electrically isolate at least a portion of the carrier from the back side of the integrated device die.

In some embodiments, for example, the carrier can comprise a second integrated device die that can be electrically connected by bond wires to a package substrate (such as a leadframe substrate, a laminate or printed circuit board substrate, a ceramic substrate, a hybrid substrate, glass, etc.). In some embodiments, a portion of the wire bonds (or bond wires) can be disposed between the carrier and the back side of the die. The portion of the wire bonds can be embedded in the first layer, but the portion of the wire bonds may not penetrate the second isolating layer (e.g., the second element). The second layer can therefore serve to physically and electrically isolate the bond wires from the back side of the integrated device die, which can beneficially reduce the risk of shorting out the signals transmitted through the bond wires.

In some embodiments, the second isolating layer can comprise a solid back side coating applied to the back side of the integrated device die. In some embodiments, the second layer can be disposed or embedded between the first layer and a third layer comprising a third insulating material. In some embodiments, the third insulating material can comprise the same insulating adhesive material as the first insulating adhesive material of the first layer (e.g., a DAF). For example, in some embodiments, the third insulating material can comprise a first flowable state and a second cured or hardened state. In other embodiments, the third and first insulating materials may differ. In various embodiments, therefore, the first, second, and third layers can comprise a multi-layer mounting structure or tape for attaching a die to a carrier and for electrically isolating a back side of the die from the carrier.

In still other embodiments, the second insulating element can comprise a spacer (e.g., a floating spacer) disposed between the integrated device die and the first layer. In various embodiments, the spacer can comprise a material that has a coefficient of thermal expansion (CTE) closely matched to the CTE of the integrated device die and/or the carrier. Beneficially, therefore, the spacer can server to reduce or eliminate stresses imposed by the die on the carrier, and vice versa. In some embodiments, the spacer can also serve to electrically isolate the back side of the die from at least a portion of the carrier. In some embodiments, the spacer can comprise a material that can serve as an inductor or coil (or another structure), or a patterned material that can enhance the electrical characteristics of the package. For example, in some embodiments, the spacer can have energy-harvesting devices, sensing devices, etc. For example, in some embodiments, the spacer can comprise a material that is clear, visually transparent, opaque, etc. For example, in some embodiments, the spacer can comprise a band pass filter that filters certain wavelengths of light. For example, in some embodiments, the spacer can comprise a laminate substrate.

FIG. 1A is a schematic side view of an integrated device package 1 prior to mounting an integrated device die 2 to a carrier 3. The integrated device die 2 can comprise any suitable type of device die that includes active circuitry or components, for example, a processor die with integrated circuitry formed or defined therein, a microelectromechanical systems (MEMS) die, a memory die, a sensor die, etc. The die 2 can comprise a front side 6 and a back side 7 opposite the front side 6. In some embodiments, the active components or circuitry can be provided at or near the front side 6. In other embodiments, the active components or circuitry can be provided at or near the back side 7. As shown in FIG. 1A, an insulating layer 4 can be provided over the back side 7 of the integrated device die 2. In some arrangements, the insulating layer 4 can comprise a die attach film (DAF) that is deposited, printed (e.g., screen printed), or laminated on the back side 7 of the die 2. In some arrangements, the insulating layer 4 can be spread as a paste or epoxy over the die 2 or the carrier 3. In some arrangements, the insulating layer 4 can comprise a sheet of insulating material that is applied to the back side 7 of the die 2.

In FIG. 1A, the carrier 3 comprises a second integrated device die having active circuitry or other components, such as integrated circuitry, microelectromechanical systems (MEMS) components, etc. As with the integrated device die 2, the carrier 3 can comprise a front side 8 and a back side 9 opposite the front side 8. In the embodiment shown in FIG. 1A, the carrier 3 can be mounted to a package substrate (not shown), such as a leadframe substrate, a laminate or printed circuit board (PCB) substrate, a ceramic substrate, a hybrid substrate, glass, etc. One or more bond wires 5 can electrically connect bond pads on the front side 8 of the carrier 3 to another packaging structure, such as to corresponding leads or pads of the package substrate, or to another integrated device die. In other embodiments, however, the carrier 3 can comprise another packaging structure, such as a package substrate (see, e.g., Examples 3 and 4 of FIG. 6).

FIG. 1B is a schematic side view of an integrated device package 1 after the integrated device die 2 is mounted to or stacked on the carrier 3. In the arrangement shown in FIG. 1B, the die 2 and carrier 3 can be physically brought together. The insulating layer 4 can comprise a flowable state (e.g. when heated) and a hardened state (e.g., when cured, or after settling naturally into the cured state). In some arrangements, the insulating layer 4 can be heated or melted, for example, to cause the insulating layer 4 to be flowable. In some arrangements, for example, the insulating layer 4 can change to the flowable state upon heating the package 1, for example, heating to a temperature in a range of 150° C. to 200° C. in some embodiments. The insulating layer 4 in the flowable state can flow around the bond wires 5 such that a portion of the bond wires 5 is embedded in the insulating layer 4. The insulating layer 4 can change to the hardened or solid state. In some arrangements, the insulating layer 4 can harden as it cools. In other arrangements, the insulating layer 4 can be baked to harden the layer 4. The hardened insulating layer 4 can thereby mechanically couple the die 2 to the carrier 3.

One problem associated with the package of FIG. 1B is that the bond wires 5 may contact the back side 7 of the integrated device die 7. For example, during assembly and/or use of the package 1, the back side 7 of the die may shift downwardly and contact the bond wire(s) 5 in a region 10 shown in FIG. 1B. Contact between the back side 7 of the die and the bond wires 5 can cause an electrical short, which can reduce the performance of the package 1 and/or its components. In addition, the insulating layer 4 may electrically break down without any physical contact, e.g., in arrangements in which the physical thickness of the layer 4 or the separation between the die 2 and carrier 3 is not large enough relative to the applied voltage.

Accordingly, various embodiments herein can beneficially reduce or eliminate the risk of electrical shorting between the bond wires 5 and the die 2. FIG. 2A is a schematic side view of a wafer 2' temporarily mounted to a wafer mount 11 by way of a wafer tape having a structural layer 12 and an insulating adhesive layer 4, according to various embodiments. The wafer 2' can comprise a semiconductor wafer that is patterned or formed to comprise a plurality of the integrated device dies, which may be similar to the dies 2 shown in FIGS. 1A-1B. As shown in FIG. 2A, the insulating adhesive layer 4 can be applied over the back side of the wafer 2', and the insulating layer 4 and structural layer 12 can couple the wafer 2' to the wafer mount 11. The wafer mount 11 can support the wafer 2' during processing. Examples of the wafer tape include Adwill LE tape manufactured by Lintec Corporation of Japan, and Dicing Die Attach Film manufactured by Henkel AG & Co. of Germany.

FIG. 2B is an enlarged schematic side view of a portion of the wafer 2' coupled with the structural layer 12 of the wafer tape by way of the insulating adhesive layer 4. After dicing the wafer 2' into a plurality of diced integrated device dies (e.g., the die 2 of FIGS. 1A and 1B) and removing the structural layer 12, the arrangement shown in FIG. 2B can be the same as or similar to the package 1 shown in FIG. 1A. For example, as explained above, utilizing the single insulating adhesive layer 4 to mount the die 2 to the carrier 3 may result in shorting of the bond wires 5 and the back side 7 of the die 2.

FIG. 2C is an enlarged schematic side view of a portion of the wafer 2' coupled with the wafer tape by way of a mounting structure 15, according to some embodiments. Unlike the arrangement shown in FIG. 2B, in the embodiment of FIG. 2C, multiple insulating elements or layers can be used to couple the wafer 2' with the wafer tape. In some embodiments, the mounting structure 15 can comprise a first layer 4 of a first insulating adhesive material and a second isolating film or layer 13 of insulating material between the first layer 4 and the wafer 2'. As explained herein, the second layer 13 can serve to electrically isolate at least a portion of the carrier 3 (e.g., the bond wires 5) from the back side 7 of the die 2.

The second layer 13 can comprise a back side coat (BSC) layer that is deposited on the back side of the wafer 2', e.g., by way of lamination, dispensing, screen printed, molded, etc. The second layer 13 can comprise any suitable insulating material that is solid or hard enough such that the bond wires 5 do not penetrate the layer 13, and that electrically isolates the wires 5 from the die 2. In various embodiments, the second layer 13 can comprise a polymer, e.g., a thermoset polymer, a polyimide film or tape, etc. Unlike the first layer 4, in some embodiments, the second layer 13 may not have a flowable state, e.g., the second layer 13 may comprise a solid material without causing the layer 13 to flow or melt during assembly or manufacturing. In other embodiments, the second layer 13 can have a flowable state when it is applied to the wafer 2', but can be hardened such that the layer 13 is not flowable after mounting the wafer 2' to the wafer tape. In some embodiments, the second layer 13 (which, as explained above, can serve as an electrically isolating layer for the package) can comprise a non-penetrating tape which can be applied to the back side 7 of the wafer 2', such as Adwill LC tape manufactured by Lintec Corporation of Japan.

FIG. 3A is a flow chart illustrate a method 29 for manufacturing an integrated device package, according to some embodiments. FIG. 3B illustrates a series of schematic side views of the package 1 at various stages of the method 29 shown in FIG. 3A, according to one embodiment. FIG. 3C illustrates a series of schematic side views of the package 1 at various stages of the method 29 shown in FIG. 3A, according to another embodiment. In FIGS. 3A-3C, the method 29 begins in a block 20, in which a wafer 2' having a plurality of integrated device regions is thinned from a back side of the wafer 2' to define the back sides 7 of the dies 2 once the wafer 2' is singulated or diced. The wafer 2' can be thinned in any suitable way, for example, by etching, polishing, etc. Moving to a block 21, the second back side coat (BSC) or isolating layer 13 can be applied or deposited on the back side 7 of the wafer 2'. As explained above, the second layer 13 can comprise a non-conductive or insulating material that is applied over the back side 7 of the wafer 2' in any suitable way. For example, the second isolating layer 13 can be deposited, laminated, screen-printed, molded, or otherwise provided on the back side 7 of the wafer 2'.

For the embodiment of FIG. 3B, the method 29 moves to a block 22. In the block 22, and as shown in FIG. 3B, the method 29 includes applying the first insulating adhesive layer 4 (e.g., a die attach film, or DAF) over the second isolating layer 13 of the wafer 2'. The first layer 4 can be applied over the second layer 13 in any suitable manner, e.g., deposited or screen printed onto the second isolating layer 13. For example, as explained above in connection with FIGS. 2A-2C, the first insulating adhesive layer 4 can form part of the wafer tape (e.g., the layer 4 may be attached to the structural layer 12 of the wafer tape). The wafer 2' can be mounted to the wafer tape, and the structural layer 12 can be removed to leave the insulating adhesive layer 4 attached to the isolating layer 13 on the back side 7 of the wafer 2'.

In a block 26, the wafer 2' with layers 4, 13 can be diced, e.g., sawed, punched, etc., to define a plurality of the integrated device dies 2. Moving to a block 28, each diced die 2 can be stacked or mounted to the carrier 3. For example, the diced die 2 can be brought together with the carrier 3, which can comprise another integrated device die in some embodiments. As shown in FIG. 3B, the carrier 3 can comprise a plurality of bond wires 5 configured to electrically connect bond pads on the front surface 8 of the carrier 3 to a packaging structure (such as a package substrate), which is not illustrated in FIG. 3B. The package 1 can be heated (e.g., to a temperature in a range of 150° C. to 200° C.) to cause the first insulating layer 4 to change to the flowable state. However, the heating may not cause the second isolating layer 13 to melt or otherwise be flowable. Thus, the second layer 13 can have a higher melting point than the first layer 4 in some embodiments. In other embodiments, however, the second layer 13 may not have a higher melting point than the first layer 4. For example, once the second layer 13 is applied to the back side 7 and hardened, the second layer 13 may become a thermoset and may no longer melt. Accordingly, when the first layer 4 is heated and caused to flow, the second layer 13 may not be flowable but may remain solid.

As shown in step 28 of FIG. 3B, the first layer 4 can flow around the bonding wires 5 such that portions of the wires 5 are between the die 2 and the carrier 3 and such that the portions of the wires 5 are embedded in the first layer 4. In the embodiment of FIG. 3B, the first layer 4 can comprise a sheet of insulating material (e.g., a DAF) applied over the second layer 13. The first layer 4 can change to the hardened or cured state to mount or stack the die 2 to the carrier 3. For example, in some embodiments, the first layer 4 may naturally harden or cure as it cools down. In other embodiments, the first layer 4 can be baked to cause the layer 4 to harden or cure.

Returning to FIG. 3A, after applying the BSC in the block 21, in an alternative process, the method 29 can move to a block 23 including a block 25. In the block 25, the wafer 2' with the second BSC isolating layer 13 can be diced to define a plurality of the integrated device dies 2, e.g., by sawing, punching, laser etching, plasma etching, or any other suitable manner. Moving to a block 27, the first layer 4 can be dispensed on the front side 8 of the carrier 3. For example, the first layer 4 can comprise a flowable epoxy paste or adhesive in the flowable state, and can be dispensed around and/or over the bond wires 5 in any suitable manner. In some embodiments, for example in embodiments that provide a dispensed material with a syringe or other delivery vessel, the syringe can be heated and the dispensed epoxy material provided in any suitable pattern to control the flow and/or coverage of the epoxy. In various embodiments, the epoxy or other flowable material can be dispensed between the wires, e.g., in the middle portion of the die in the area inside or within the wire bond pads. Moving to the block 28, the die 2 can be mounted to the carrier 3. For example, the die 2 can be brought together against the first layer 4. The first layer 4 can harden (e.g., by cooling) to mount the die 2 to the carrier 3. In some embodiments, the die 2 can contact the first layer 4 when the first layer 4 is in the flowable state so as to improve adhesion between the die 2 and the first layer 4.

Thus, in FIG. 3B, the first flowable layer 4 can be applied to the wafer 2' prior to dicing the wafer 2' into the plurality of dies 2. By contrast, in FIG. 3C, the wafer 2' can be diced after applying the second layer 13 and without applying the first layer 4 to the wafer 2'. Instead, as explained above, in FIG. 3C, the first layer 4 can be applied to the carrier 3 and flowed around the wires 5 (e.g., by way of an epoxy paste). In the package 1 shown at step 28 in FIG. 3B, the multi-layer mounting structure 15 can comprise a first sidewall 37 at a side surface of the first layer 4 and a second sidewall 36 at a side surface of the second layer 13. In some embodiments, the first sidewall 37 can have a profile that is generally similar to the profile of the second sidewall 36, because both the first and second layers 4, 13 were diced in the block 26, which create markings indicative of the dicing procedure. However, some differences in the surfaces of the sidewalls 37, 36 may results due to the heating and cooling (and the resulting flowing and hardening) of the first layer 4. For example, because the first layer 4 flows when heated, the sidewall 37 of the first layer 4 may have a curved profile (e.g., concave or convex) due to the flowing of the insulating material of the layer 4. By contrast, because the second layer 13 may not flow when heated (or the melting may be significantly less pronounced than in the first layer 14), the second sidewall 36 may be more planar or straighter than the first sidewall 37 (for example, due to the dicing operation). Similarly, in the embodiment of FIG. 3C, at the step 28, the first and second sidewalls 37, 36 may likewise differ. As with FIG. 3B, the second sidewall 36 can comprise markings representative of the dicing procedure and may be generally planar or straight. By contrast, the first sidewall 37 can comprise a curved surface due to the flowable nature of the first layer 4.

The thickness of the first layer 4 can be any suitable thickness sufficient to embed the wire bonds 5. In some embodiments, the thickness of the first layer 4 can be in a range of 25 microns to 100 microns. The thickness of the second isolating layer 13 can be any suitable thickness sufficient to prevent penetration of the layer 13 by the bond wires 5 and/or to prevent shorting to the integrated device die 2. In various embodiments, for example, the thickness of the second layer 13 can be in a range of 20 microns to 120 microns, in a range of 25 microns to 100 microns, in a range of 20 microns to 75 microns, in a range of 20 microns to 60 microns, or in a range of 25 microns to 50 microns. In some embodiments, the first layer 4 and the second isolating layer 13 may have different material compositions and an identifiable interface in the final product to indicate the application of multiple layers to form the structure 15.

Advantageously, the embodiments of FIGS. 3A-3C can reduce the risk of, or can prevent, the shorting of the wires 5 and the integrated device die 2. The second layer 13 can physically and electrically isolate the wires 5 from the die 2. For example, although the wires 5 may be embedded in the first layer 4, the wires 5 may not penetrate the second layer 13 such that the wires 5 do not contact the back side 7 of the die 2. Furthermore, in some embodiments, the second layer 13 can advantageously enable the use of increased voltages as compared with other packages (e.g., when higher voltage breakdown is desired). The second isolating layer 13 can reduce electromigration into the die 2. The layer 13 also provides a desired vertical separation distance or spacing between the die 2 and carrier 3.

In addition, the isolating layer 13 may also be tuned in various embodiments to improve radio frequency (RF) performance of various types of systems. For example, the dielectric material of the layer 13 (and/or of other layers in the package) between the wires and the die 2 can be selected and/or dimensioned to improve system RF performance. In various embodiments, the layer 13 (and/or other components) can be patterned or formed to target specific frequencies or wavelengths (or ranges thereof), for example, to act as a filter for attenuating, passing, or enhancing electromagnetic signals at those frequencies or wavelengths. Such embodiments can facilitate communications between the dies. In addition, various embodiments can improve inductive and/or capacitive performance of the package. For example, in various embodiments, the layers (e.g., including layer 13) can be patterned to achieve the aforementioned advantages. Moreover, in various embodiments, microfluidic channels can be patterned in the layers (e.g., including layer 13) so as to provide fluidic communication within the package. The layers (e.g., layer 13) can also be patterned to provided locking features and/or to improve adhesion. In some embodiments, a layer (such as the isolating layer 13) may be selected and/or dimensioned to have magnetic properties that can enhance performance, provide shielding capabilities, or other suitable functionality. In some embodiments, the layer 13 can include an optical component to allow for communication between the die 2 and other components of the package or larger system.

FIG. 4A is a schematic side view of a wafer 2' temporarily mounted to a wafer mount 11 by way of a wafer tape 12, according to various embodiments. FIG. 4B is an enlarged schematic side view of a portion of the wafer 2' coupled with the wafer 12 by way of a mounting structure 15, according to some embodiments. Unless otherwise noted, the components of FIGS. 4A-4B may be similar to or the same as like numbered components of FIGS. 2A and 2C, respectively. For example, as with FIG. 2A, in FIG. 4A, the undiced wafer 2' can comprise a plurality of device regions that, when diced, define a plurality of the integrated device dies. Unlike the embodiment of FIG. 2C, however, the mounting structure or tape 15 shown in FIG. 4B can include at least three insulating layers that comprise an adhesive-insulator-adhesive stack. As with FIG. 2C, the mounting structure 15 can comprise a first insulating adhesive layer 4a that has a flowable state and a hardened or cured state (e.g., a DAF or epoxy), and a second, solid isolating layer 13 disposed above the layer 4a between the wafer tape 12 and the wafer 2'. As above, in some embodiments, the second layer 13 can have a higher melting point than the first layer 4a, which may be similar to or the same material as the first layer 4 of FIG. 2C. In other embodiments, the second layer 13 may not have a higher melting point than the first layer 4a. In some embodiments, the second layer 13 can comprise a thermoset material that hardens, and does not re-melt, after curing.

Unlike FIG. 2C, in FIG. 4B the mounting structure or tape 15 can comprise a third insulating adhesive layer 4b over the second layer 13 and between the second layer 13 and the wafer 2' (and therefore between the second layer 13 and the die 2 after dicing as shown in FIG. 5B). As shown in FIG. 4B, the second layer 13 can be embedded or sandwiched between the first and third layers 4a, 4b. In the illustrated embodiment, the third layer 4b can comprise the same material (or a generally similar material) as the first layer 4a. For example, the third layer 4b can comprise a third insulating adhesive material that has a flowable state and a hardened or cured state. In other embodiments, the first and third layers 4a, 4b may comprise different materials. Beneficially, as explained herein, providing the first and third layers 4a, 4b that have respective flowable states on opposite sides of the second layer 13 can enable adhesion to both, opposite sides of the structure or tape 15. Thus, in some embodiments, heating the tape 15 of FIG. 4B can cause the first and third layers 4a, 4b to flow, and the flowable layers 4a, 4b can contact a carrier and the die 2, respectively. Once the layers 4a, 4b are cured or hardened, the hardened layers 4a, 4b can beneficially improve the adhesion of the die 2' and the carrier to the structure 15.

In some embodiments, the tape 15 can be formed by applying or depositing the films or layers 4a, 4b on the opposite sides of the second insulating layer 13. In some embodiments, the second layer 13 can be embedded within a flowable material (such as the first flowable layer 4 discussed above) and cut to define the first layer 4a on one side of the second layer 13 and the third layer 4b on the other side of the second layer 13. In some embodiments, the first layer 4a, the second isolating layer 13, and the third layer 4b may have different material compositions and an identifiable interface in the final product to indicate the application of multiple layers to form the structure 15. For example, the thickness of the tape 15 can be in a range of 70 microns to 300 microns, or in a range of 100 microns to 300 microns. The thickness of the first insulating adhesive layer 4a can be any suitable thickness, as explained above, for example in a range of 25 microns to 100 microns. Similarly, the thickness of the third layer 4b can be in a range of 25 microns to 100 microns. The thickness of the second isolating layer 13 can be in a range of 20 microns to 120 microns, in a range of 25 microns to 100 microns, in a range of 20 microns to 75 microns, in a range of 20 microns to 60 microns, or in a range of 25 microns to 50 microns. In various embodiments, the thickness of the second isolating layer 13 can be tuned according to various desired electrical characteristics, e.g., the layer 13 can be made thicker for packages that operate at high voltages so that the thickness can be sufficient so as to avoid electrical breakdown.

Figure 5A:
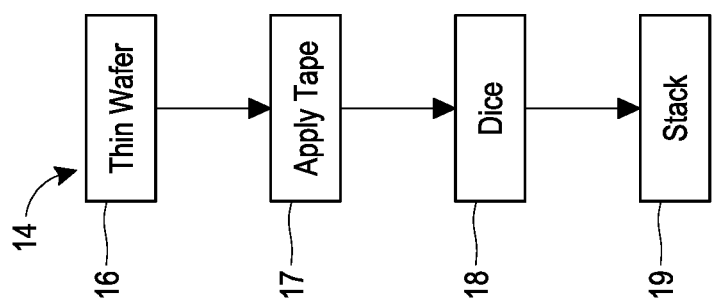
FIG. 5A is a flowchart illustrating a method for manufacturing an integrated device package, according to some embodiments.

FIG. 5A is a flowchart illustrating a method 14 for manufacturing an integrated device package 1, according to some embodiments. FIG. 5B illustrates a series of schematic side views of the package 1 at various stages of the method 14 shown in FIG. 5A, according to one embodiment. As with the embodiment of FIGS. 3A-3C, in FIGS. 5A and 5B, the method 14 can begin in a block 16 to thin the wafer 2'. The wafer 2' can be thinned by way of, for example, etching, polishing, etc. Turning to a block 17, the mounting structure or tape 15 can be applied to the back side 7 of the wafer 2'. The multi-layered tape 15 can comprise the three layers 4a, 13, 4b described above in connection with FIGS. 4A-4B, such that the layers 4a, 13, 4b form a multi-layered structure that can be applied to the back side 7 of the entire (or portions of the) wafer 2'. The third layer 4b of the multi-layer tape 15 can be attached to the back side 7 of the wafer 2' in any suitable manner to connect the multi-layer mounting structure or tape 15 to the wafer 2'.

Turning to block 18, the wafer 2' can be diced in any suitable way (e.g., sawed, punched, etc.) to define a plurality of the integrated device dies 2. Moving to a block 19, the diced die 2 can be stacked or mounted to the carrier 3 by way of the mounting structure or tape 15. For example, as explained above, the first layer 4a can be brought into contact with the bonding wires 5 of the carrier 3. The package 1 can be heated to cause the first layer 4a to flow around the bonding wires 5. Once the first layer 4a is cured or hardened, the die 2 can be securely adhered to the carrier 3. Furthermore, as explained above in connection with FIGS. 3A-3C, the second layer 13 can serve to electrically isolate the back side 7 of the die 2 from the carrier 3, e.g. from the bonding wires 5. The use of the three layers 4a, 13, 4b in FIG. 5B can beneficially improve adhesion of the die 2 to the multi-layer tape 15 (by way of the adhesion of the third layer 4b to the back side 7 of the die 2), and the adhesion of the multi-layer tape 15 to the carrier 3 (by way of the adhesion of the first layer 4a to the front side 8 of the carrier 3), while preventing or reducing the risk of shorts of the wires 5 to the die 2.

Figure 6:
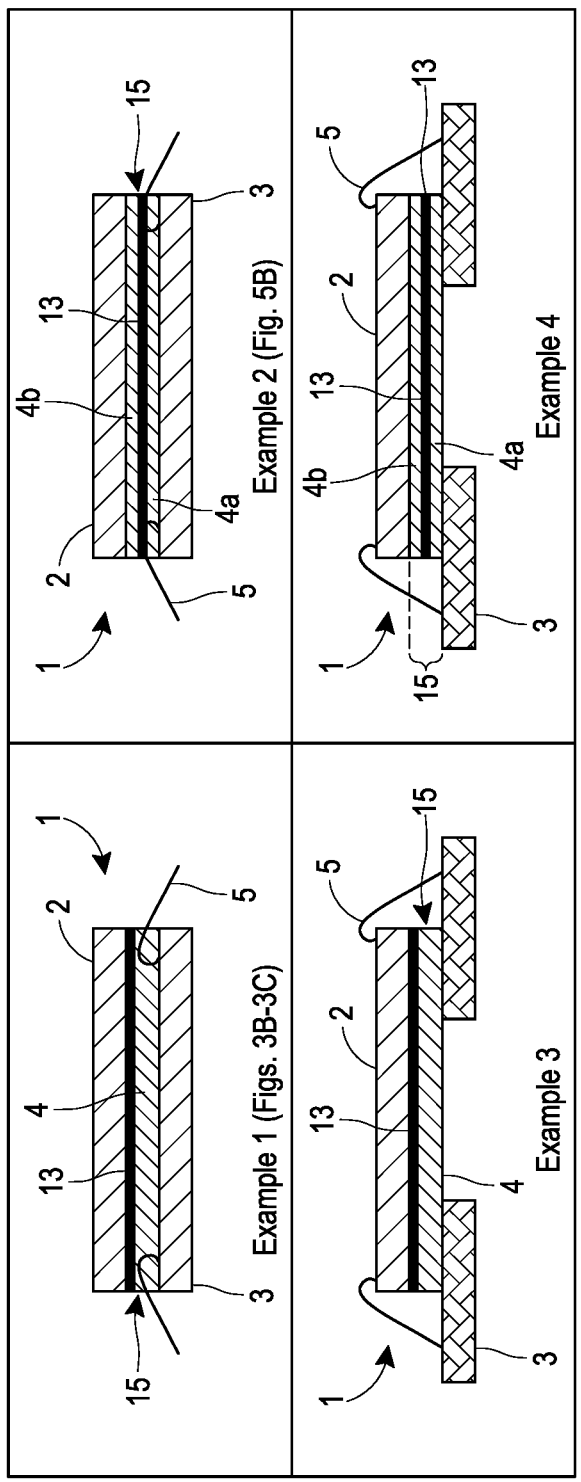
FIG. 6 illustrates four (4) example implementations of the embodiments of the multi-layer mounting structure or tape disclosed herein.

FIG. 6 illustrates four (4) example implementations of the embodiments of the multi-layer mounting structure or tape 15 disclosed herein. Example 1 illustrates the embodiments of the integrated device package 1 formed in the process shown in FIGS. 3B-3C. Example 2 illustrates the embodiment of the integrated device package 1 formed in the process shown in FIG. 5B. As explained above, in Examples 1 and 2, the carrier 3 can comprise an additional integrated device die that is electrically connected to a package substrate (not shown) by bond wires 5.

However, in Examples 3 and 4, the carrier 3 can instead comprise a package substrate upon which the integrated device die 2 is mounted. In Example 3, the die 2 is mounted to the carrier 3 (package substrate) using the multi-layer mounting structure or tape 15 shown in FIGS. 3B-3C. In Example 4, the die 2 is mounted to the carrier 3 (package substrate) using the multi-layer mounting structure or tape 15 shown in FIG. 5B. In Examples 3 and 4, the carrier 3 can comprise a leadframe package substrate having a die pad and/or a plurality of leads. In other embodiments, however, the carrier 3 can comprise other types of package substrates or packaging structures, such as a PCB substrate, a ceramic substrate, etc. Beneficially, the embodiments of Examples 3 and 4 can securely adhere the die 2 to the carrier 3, and may reduce processing costs as compared with other processes that mount the die 2 to the package substrate (for example, may obviate the use of other, multi-step mounting processes). For example, current processes may utilize multiple (e.g., two) layers of a screen-printed epoxy paste for mounting the die 2 to the leadframe substrate. Screen-printing may incorporate multiple mechanical and thermal cycles, and may incur substantial processing costs. Utilizing the tape 15 in the devices of Examples 3 and 4 can reduce these manufacturing complexities and costs.

Figure 7:
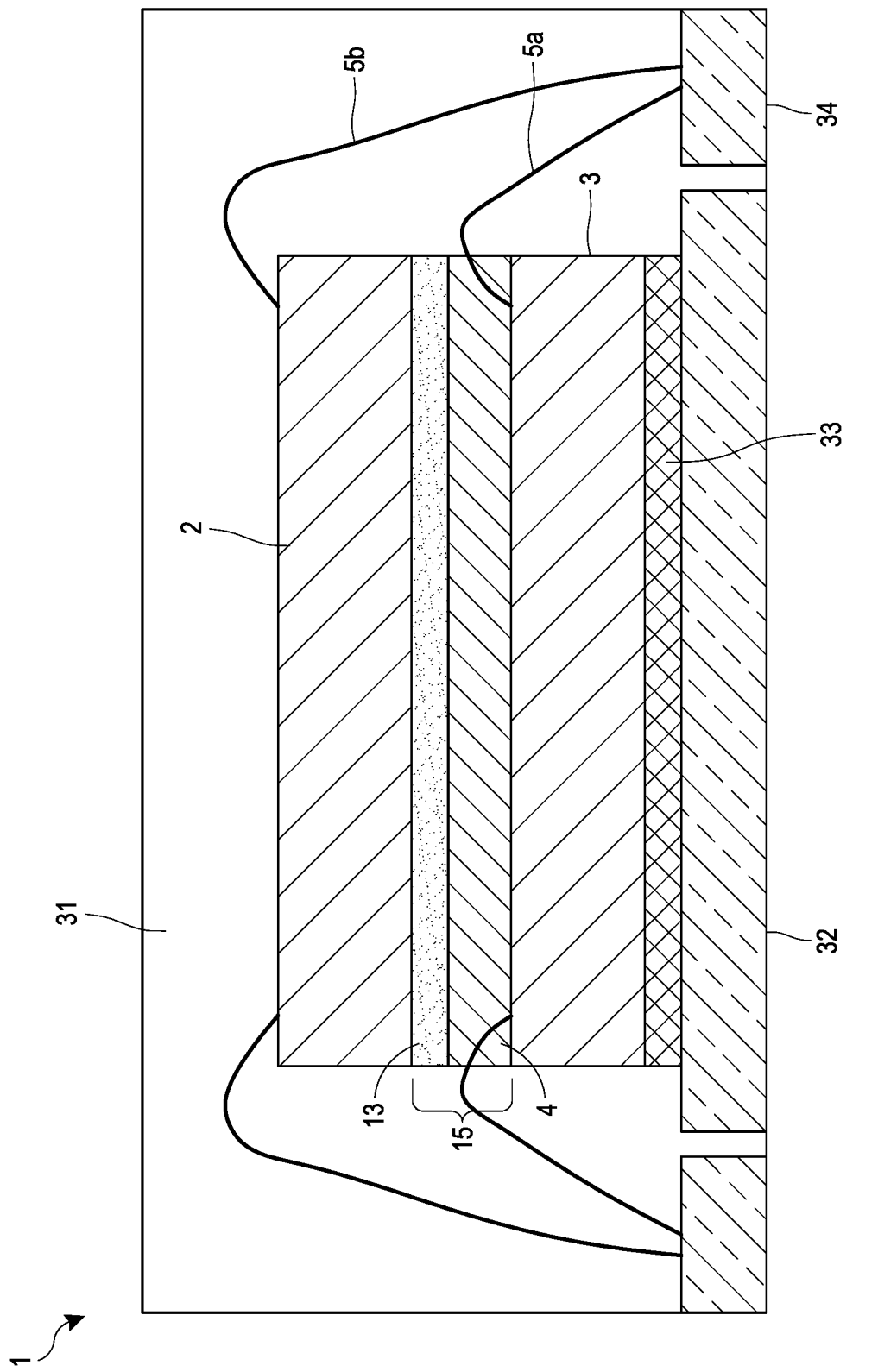
FIG. 7 is a schematic side sectional view of an integrated device package in which the carrier is mounted to a package substrate.

FIG. 7 is a schematic side sectional view of an integrated device package 1 in which the carrier 3 is mounted to a package substrate. The package substrate shown in FIG. 7 comprises a leadframe substrate having a die pad 32 electrically spaced from a plurality of leads 34. The package 1 of FIG. 7 illustrates the integrated device die 2 mounted to the carrier 3 (another integrated device die) by way of the multi-layer mounting structure 15 shown and described above in connection with FIGS. 3B and/or 3C. However, it should be appreciated that the die 2 can instead be mounted to the carrier 3 by way of the multi-layer mounting structure 15 shown and described in connection with FIG. 5B. The carrier 3 can be mounted to the die pad 32 by way of a suitable die attach material 33. In FIG. 7, first bonding wires 5a can electrically connect the carrier 3 to the leads 34. Second bonding wires 5b can electrically connect the die 2 to the leads 34. In other embodiments, the die 2 can be flip chip mounted to the carrier 3. In some embodiments, a molding compound or encapsulant 31 can be provided over upper surfaces of the die pad 32 and leads 34, over the bonding wires 5a, 5b, and over the stacked die 2 and carrier 3. The leadframe substrate (e.g., the leads 34 and die pad 32) can be mounted to a system board or motherboard to connect the package to the larger electronic device or system.

Figure 8A:
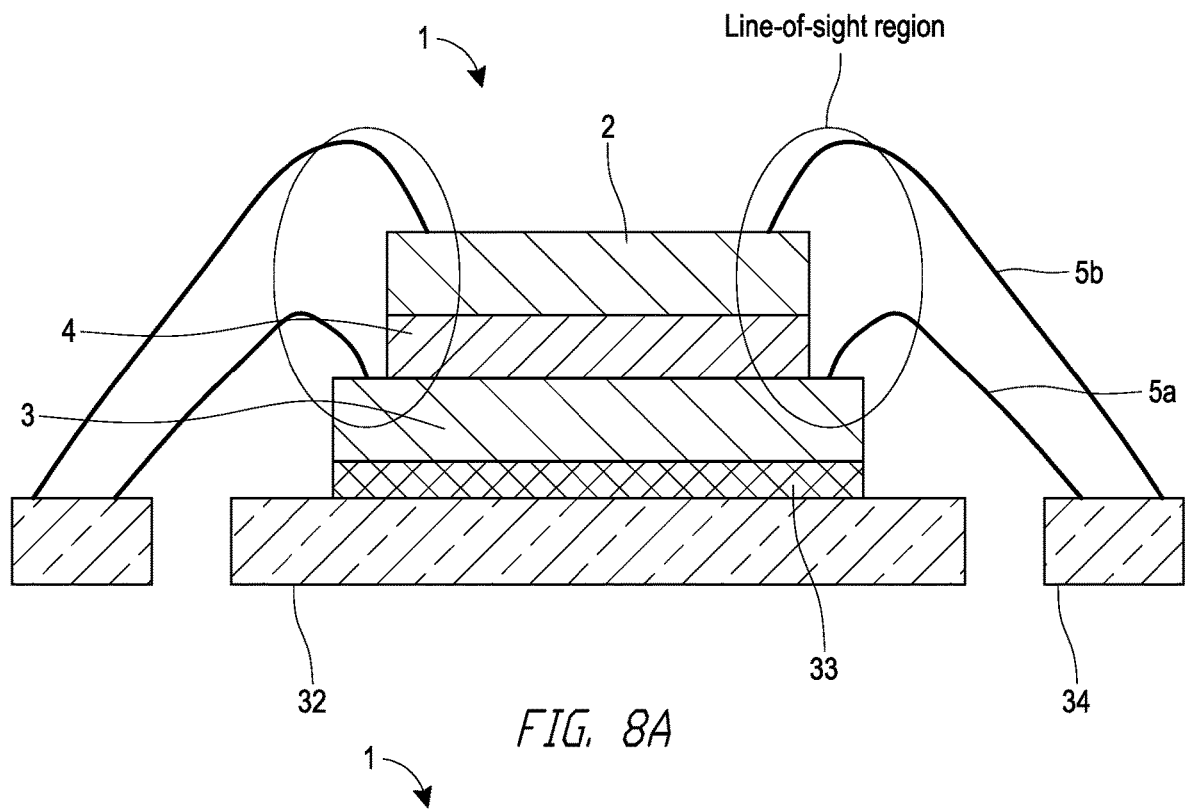
FIG. 8A is a schematic side view of an integrated device package in which the die is mounted to the carrier by only the intervening insulating adhesive layer.
Figure 8B:
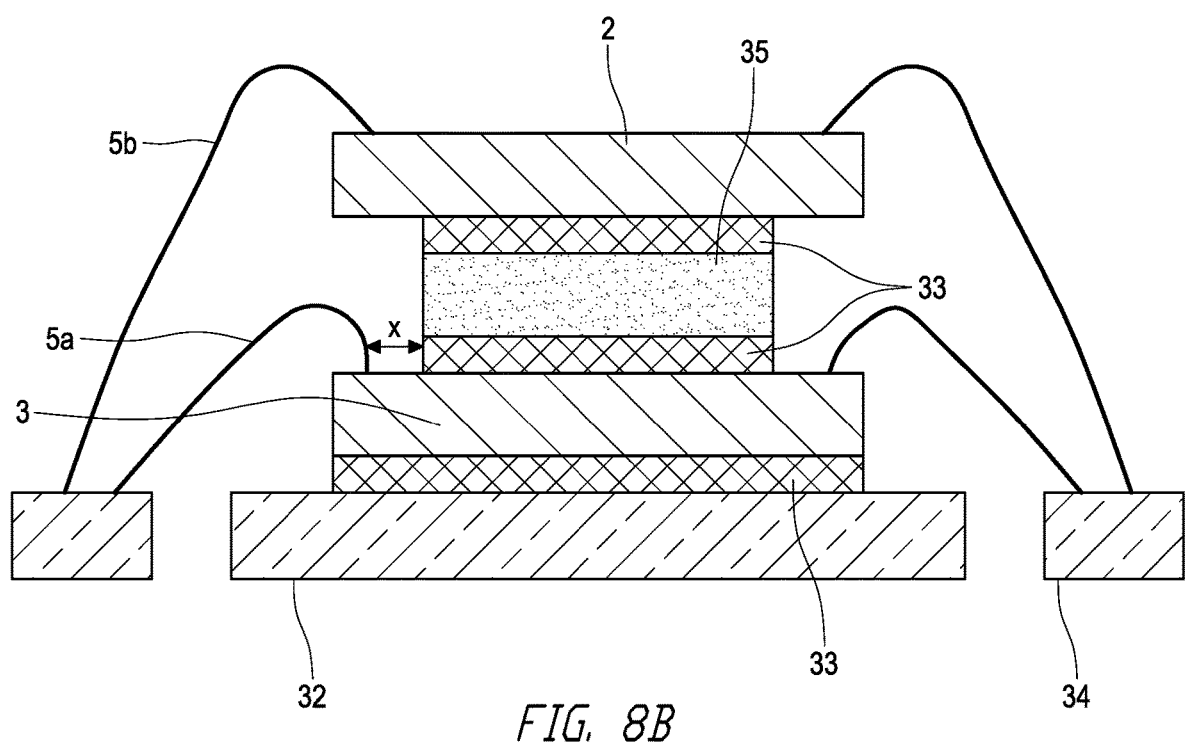
FIG. 8B is a schematic side view of an integrated device package in which the die 2 is mounted to the carrier by way of an intervening spacer.

FIGS. 8A-8B illustrate various packages 1 in which an integrated device die 2 is stacked or mounted to a carrier 3 that comprises another integrated device die. Unless otherwise noted, components of FIGS. 8A-8B may include the same or similar components as like-numbered components shown in FIGS. 1-7. FIG. 8A is a schematic side view of an integrated device package 1 in which the die 2 is mounted to the carrier 3 by only the intervening insulating adhesive layer 4. In FIG. 8A, the lateral footprint of the die 2 is smaller than the lateral footprint of the carrier 3. FIG. 8B is a schematic side view of an integrated device package 1 in which the die 2 is mounted to the carrier 3 by way of an intervening spacer 35, which may comprise silicon or any other suitable material. The spacer 35 can be attached to the carrier 3 by a die attach material 33, and the die 2 can be attached to the spacer 35 by a die attach material 33.

The arrangements of FIGS. 8A-8B may experience various shortcomings as compared with various other embodiments disclosed herein. In FIG. 8A, the bonding wires 5a may not be disposed between the die 2 and the carrier 3, such that there may be a line of sight or open gap between the wires 5a and the die 2. Such a line of sight may cause arcing between the wires 5a and the wires 5b, and/or between the wires 5a and the die 2. Furthermore, in FIG. 8A, the die 2 may tilt during assembly and/or use, which can further increase the risk of arcing. Similarly, in the arrangement of FIG. 8B, a gap X may be provided between the spacer 35 and the bond wire 5a, but such an arrangement may nevertheless risk arcing or shorting if the die 2 tilts downwardly, and/or if there is bleedout of the die attach material 33. Furthermore, in the arrangements shown in FIGS. 8A-8B, mounting the die 2 to the carrier 3 with the illustrated intervening structures may induce stresses on the carrier 3, and/or vice versa. For example, in FIG. 8B, attaching the spacer 35 to the carrier 3 may induce localized stresses in the carrier 3 (and/or in the die 2) around the perimeter of the spacer 35. Further, if the materials of the spacer 35, the die 2, and/or the carrier 3 have different CTEs, and the package 1 is heated, stresses may also be induced in the package 1. When an enacapsulant or molding compound is provided over the die 2 and carrier 3, these induced stresses may be effectively locked into the package 1.

Figure 9A:
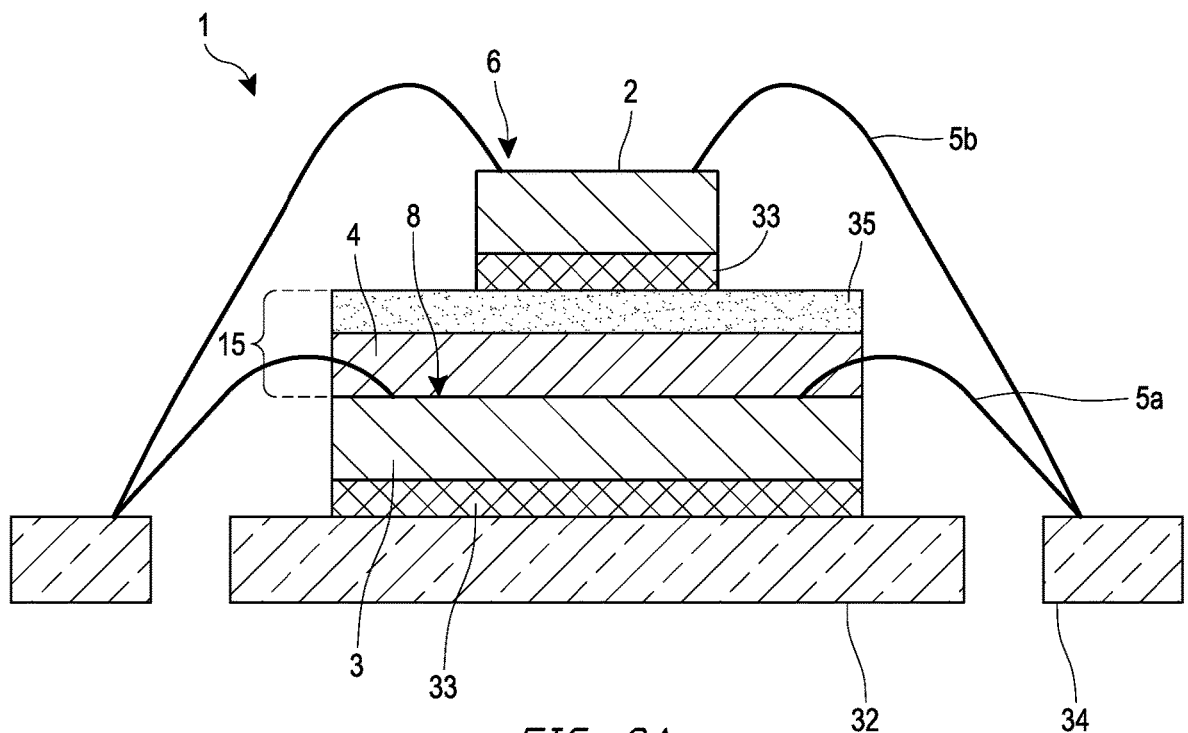
FIG. 9A is a schematic side view of an integrated device package comprising an integrated device die mounted to a carrier by way of a multi-layer mounting structure comprising a first insulating layer and a second spacer layer between the first layer and the die.
Figure 9B:
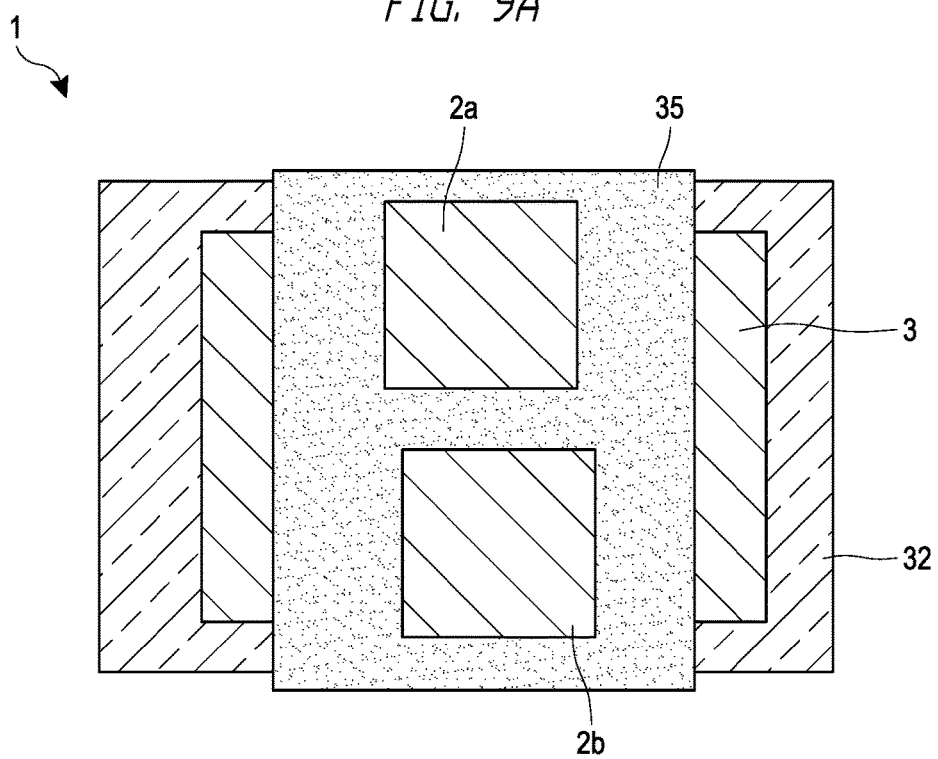
FIG. 9B is a schematic plan view of the integrated device package shown in FIG. 9A.

Accordingly, there remains a continuing need for improved integrated device packages that reduce the risk of electrical shorting or arcing, and that reduce stresses in the package components. FIG. 9A is a schematic side view of an integrated device package 1 comprising an integrated device die 2 mounted to a carrier 3 by way of a mounting structure 15 comprising a first insulating layer 4 and a second insulating element comprising a second spacer layer 35 between the first layer 4 and the die 2. FIG. 9B is a schematic plan view of the integrated device package 1 shown in FIG. 9A. Unless otherwise noted, the components of FIGS. 9A-9B are the same as or generally similar to like-numbered components of FIGS. 1A-8B. As shown in FIG. 9A, the carrier 3 (which can comprise an integrated device die) can be mounted to the die pad 32 of a leadframe substrate, for example, by way of the die attach material 33. One or more wire bonds 5a can be provided to electrically connect bond pads at the front side 8 of the carrier 3 with corresponding leads 34 of the leadframe substrate.

As discussed above with respect to the embodiments of FIGS. 3A-7, the die 2 can be mounted or stacked to the carrier 3 by way of a mounting structure 15. In the embodiment shown in FIG. 9A, the mounting structure 15 can comprise a first insulating adhesive layer 4 (which may be the same as or similar to the layers 4 and 4A described above) having a flowable state and a hardened or cured state. The mounting structure 15 can further comprise a second insulating element comprising a spacer 35 disposed between the die 2 and the first layer 4. In FIG. 9A, the mounting structure 15 includes the spacer 35 and insulating layer 4, but in other embodiments, the mounting structure 15 can include the second isolating layer 13 and/or the third layer 4a described in FIGS. 3B-3C and 5B. The mounting structure 15 can be brought into contact with the bond wires 5a and can be changed into the flowable state (e.g., by heating the package 1). The first layer 4 can flow around and over the bond wires 5a. The first layer 4 can cure to securely attach the mounting structure 15 to the carrier 3.

In various embodiments, the mounting structure 15 can be formed by attaching or depositing the spacer 35 to the insulating adhesive layer 4, and the mounting structure 15 can subsequently be attached to the carrier 3. In some embodiments, the insulating adhesive layer 4 can be attached to the carrier 3 (e.g., flowed around the wire bonds 5 and cured), and the spacer 35 can be applied, deposited or attached to the insulating layer. Still other ways of forming the mounting structure 15 may be suitable. The integrated device die 2 can be mounted to the spacer 35 of the mounting structure by way of a die attach material 33. Bond pads at the front side 6 of the die 2 can be connected to corresponding leads 34 of the leadframe substrate. The bond pads at the front side 6 of the die 2 can be connected to corresponding leads 34 by way of the bond wires 5b. In the arrangement shown in FIG. 9A, each layer may comprise any suitable thickness. For example, the thickness of the first insulating layer 4 can be in a range of 25 microns to 100 microns. The thickness of the spacer 35 can be any suitable thickness for reducing stresses and/or for providing electrical isolation of the die, e.g., the thickness can be in a range of 100 microns to 200 microns. The thickness of the die attach material 33 that attaches the carrier 3 to the die attach pad 32 can be in a range of 15 microns to 75 microns, or any other suitable thickness. The thickness of the die attach material 33 that attaches the die 2 to the spacer 35 can be in a range of 15 microns to 75 microns, or any other suitable thickness.

Advantageously, the embodiment shown in FIGS. 9A-9B may prevent or reduce the risk of shorting the bond wires 5 to the die 2, as explained above. For example, the spacer 35 may comprise a material that prevents penetration of the bond wires 5. In addition, the material of the spacer may be selected so as to closely match a coefficient of thermal expansion (CTE) of the die 2 and/or the carrier 3. For example, in various embodiments, the CTE of the spacer 35 can be within at least +/−50% of the CTE of the integrated device die 2, within at least +/−75% of the CTE of the integrated device die 2, within at least +/−90% of the CTE of the integrated device die 2, or within at least +/−95% of the CTE of the integrated device die 2. In some embodiments, the CTE of the spacer 35 can be substantially the same as the CTE of the die 2. The CTE of the spacer can be within at least +/−50% of the CTE of the carrier 3, within at least +/−75% of the CTE of the carrier 3, within at least +/−90% of the CTE of the carrier 3, or within at least +/−95% of the CTE of the carrier 3. In some embodiments, the CTE of the spacer 35 can be substantially the same as the CTE of the carrier 3. Beneficially, therefore, matching the CTE of the spacer 35 with the CTE of the carrier 3 and/or die 2 can reduce overall stresses in the package 1. Furthermore, in FIG. 9A, by providing the spacer 35 over a lateral footprint that is wider than the die 2, the spacer 35 can spread any stresses induced by the die 2 over a larger area, reducing local stress concentrations, such as those created around the perimeter of the spacer 35 shown in FIG. 8B. The spacer 35 can comprise any suitable material, including, for example, a semiconductor (e.g., silicon), a polymer, etc. In some embodiments, the spacer 35 can comprise a tunable structure, e.g., a bimetallic strip which can be tuned to achieve a desired CTE. In still other embodiments, the spacer 35 can be tuned to have a desired, predetermined CTE mismatch to induce a particular stress for a particular electrical reaction and/or behavior.

Furthermore, as shown in FIG. 9B, multiple integrated device dies 2a, 2b (which may comprise the same or different type of integrated device die) can be mounted laterally side-by-side on the spacer 35. Beneficially, including multiple dies 2a, 2b on the spacer 35 may improve redundancy for the package 1, for example, if the dies 2a, 2b perform at least some overlapping functions. The spacer 35 can create the same stress conditions for the dies 2a, 2b, which may improve the electrical performance of the dies 2a, 2b. In some embodiments, multiple (e.g., two, three, four, etc.) spacers 35 may be provided. For example, multiple dies 2A, 2B, etc. can be mounted to corresponding multiple spacers. In some embodiments, more than two integrated device dies may be mounted on the spacer 35.

Figure 10A:
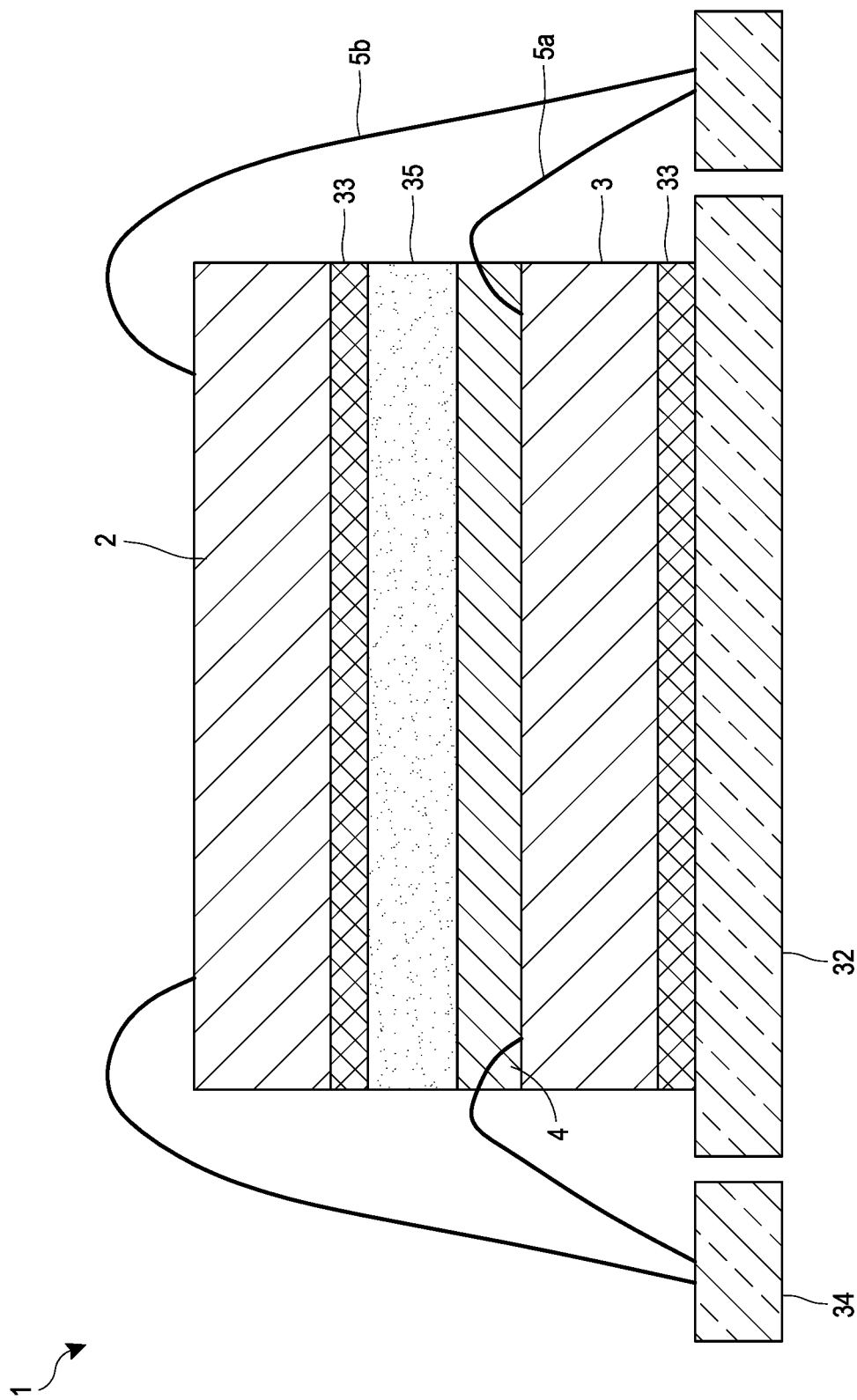
FIG. 10A illustrates an integrated device package that incorporates a multi-layer mounting structure that comprises the first insulating layer and the spacer, according to one embodiment.

FIGS. 10A-13 illustrate embodiments that incorporate a multi-layer mounting structure that comprises the first insulating layer and the spacer 35. FIG. 10A is a side view of a package 1 in which the integrated device die 2 can be approximately the same lateral size or footprint (in at least one horizontal dimension) as the spacer 35. The spacer 35 in FIG. 10A may be approximately the same lateral size or footprint (in at least one horizontal dimension) as the carrier 3. FIG. 10B is a side view of a package 1 that includes two integrated device dies 2, 2' and a carrier 3 (which may also comprise an additional, third integrated device die). In the illustrated embodiment, the integrated device die 2 can be mounted to the carrier 3 by way of the adhesive 4, the spacer 35, and the die attach material 33. A second integrated device die 2' can be mounted to the integrated device die 2 by way of a second adhesive 4', a second spacer 35', and a second die attach material 33'. As with the package 1 illustrated in FIG. 10A, and the package 1 illustrated in FIG. 10B, the lateral size of the integrated device dies 2, 2' can be the same as the lateral size of the spacer 35. However, unlike the carrier 3 of FIG. 10A, the carrier 3 illustrated in FIG. 10B can be connected to the die pad 32 via conductive bumps 38. The integrated device dies 2, 2' can be wire bonded to the leads 34 by way of bonding wires 5b, 5b'.

Figure 10B:
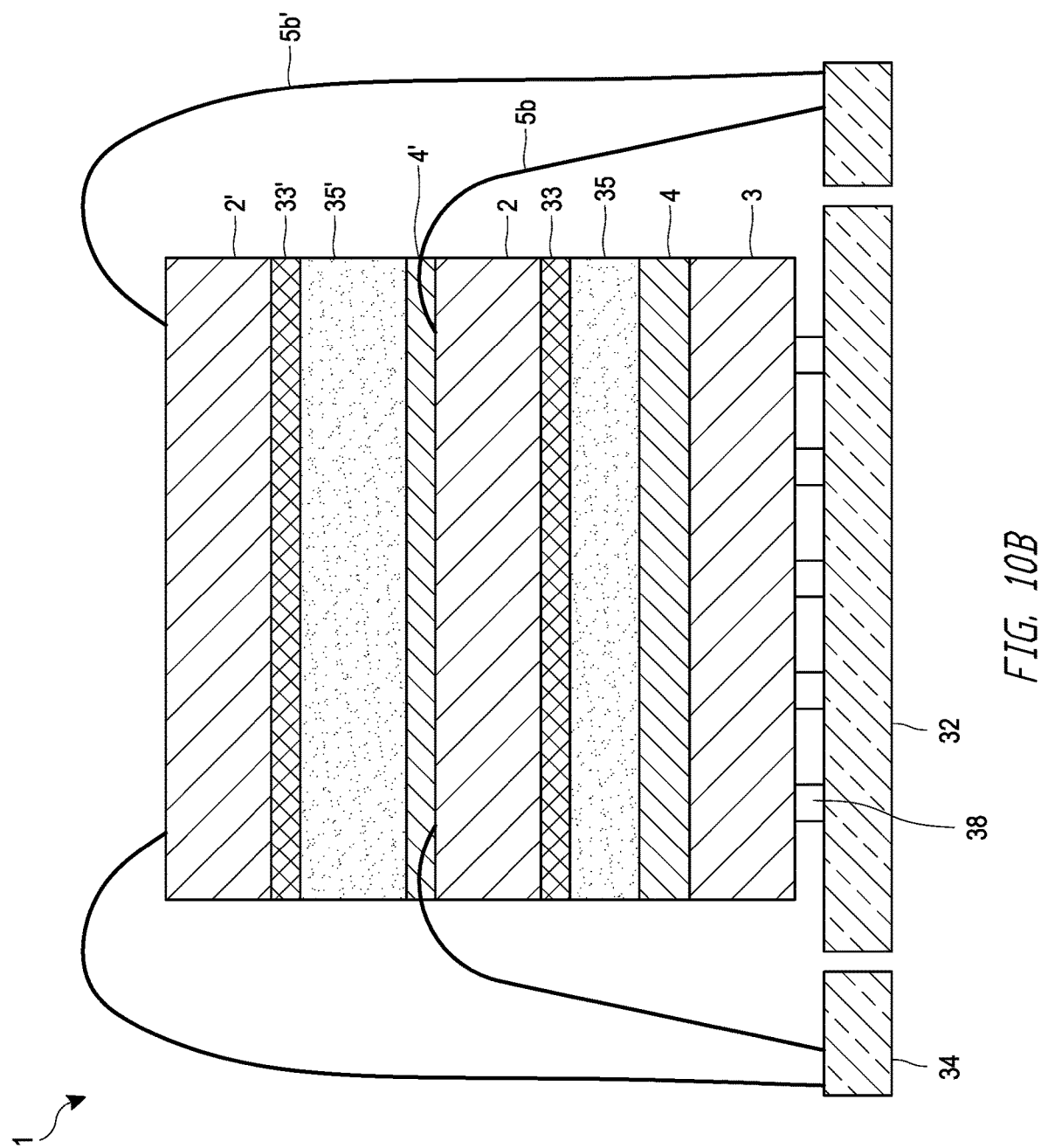
FIG. 10B illustrates an integrated device package that incorporates a multi-layer mounting structure that comprises the first insulating layer and the spacer, according to another embodiment.
Figure 11:
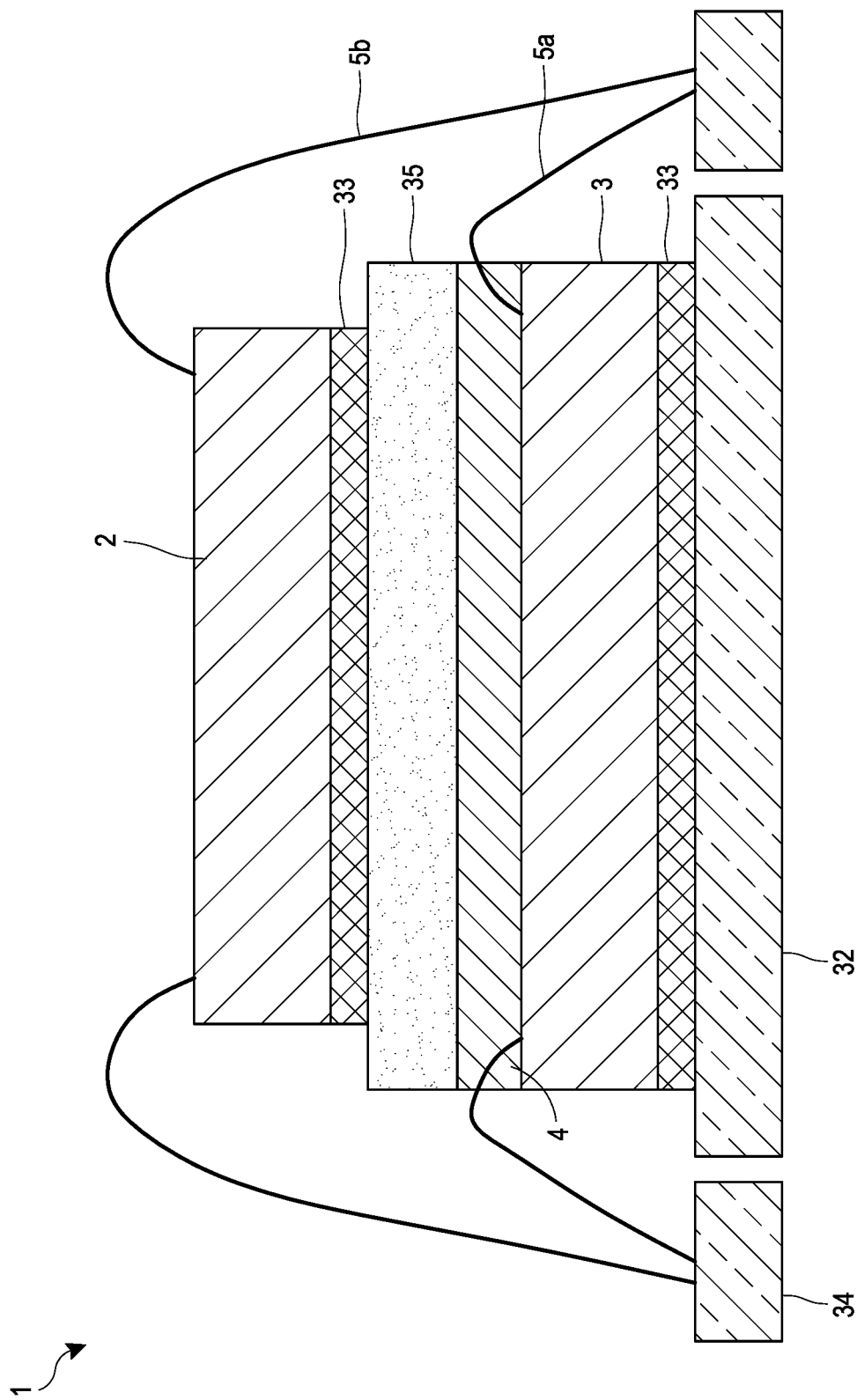
FIG. 11 illustrates an integrated device package that incorporates a multi-layer mounting structure that comprises the first insulating layer and the spacer, according to another embodiment.
Figure 12:
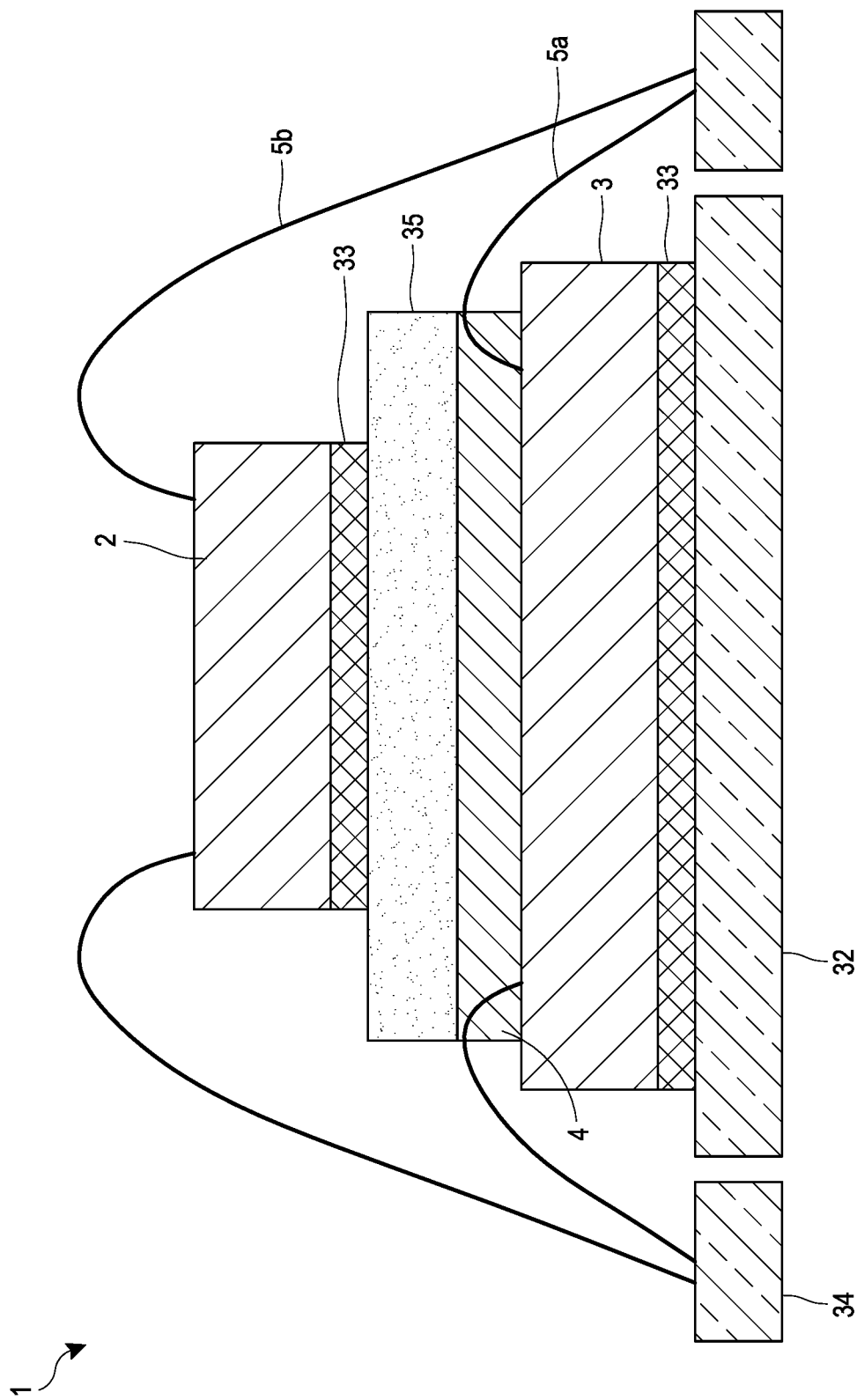
FIG. 12 illustrates an integrated device package that incorporates a multi-layer mounting structure that comprises the first insulating layer and the spacer, according to another embodiment.
Figure 13:
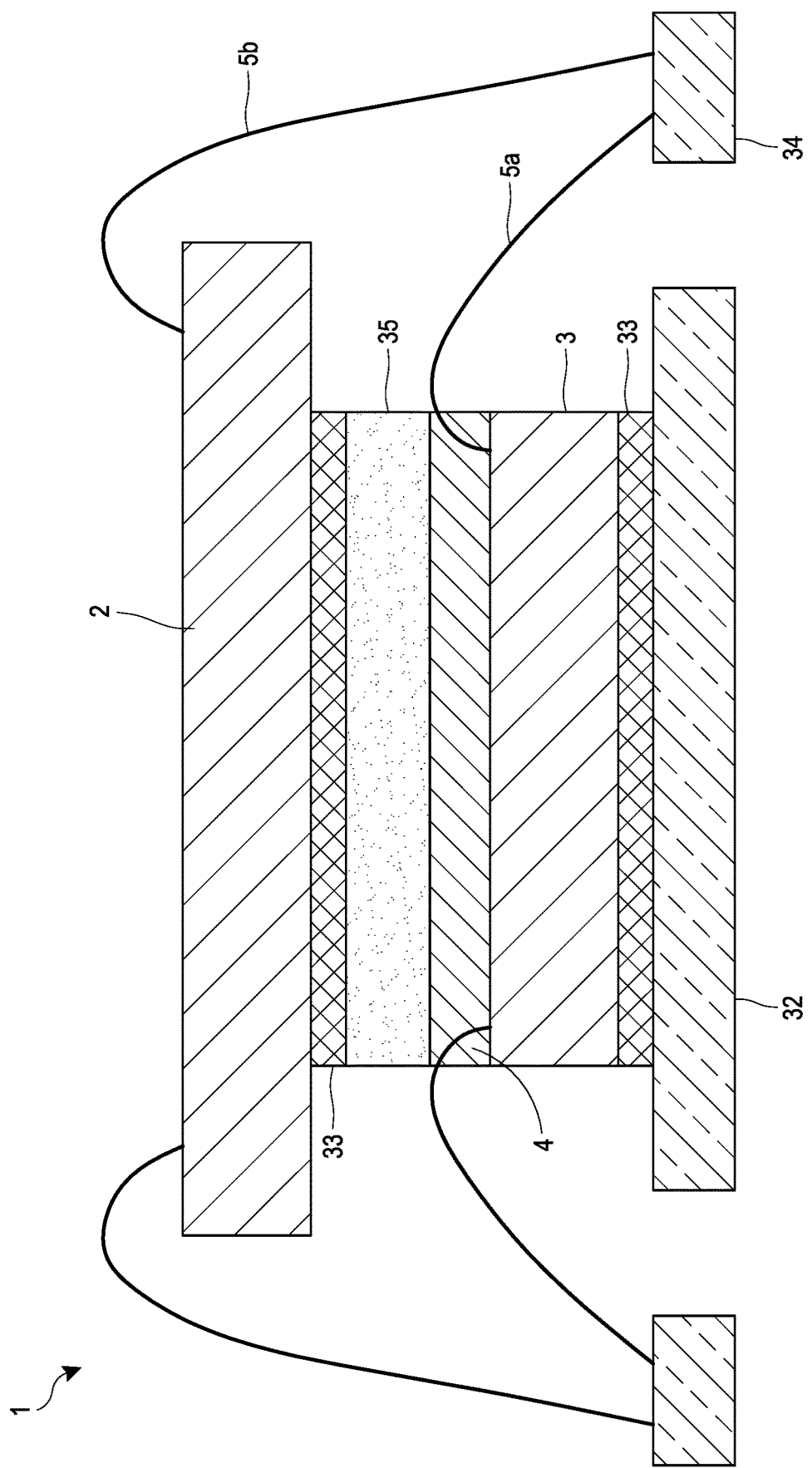
FIG. 13 illustrates an integrated device package that incorporates a multi-layer mounting structure that comprises the first insulating layer and the spacer, according to another embodiment.

In contrast to FIGS. 10A and 10B, in FIG. 11, the integrated device die 2 may have a lateral size or footprint that is smaller than the lateral size or footprint of the spacer 35 and/or the carrier 3. In FIG. 11, the spacer 35 may have a lateral size or footprint in at least one lateral dimension that is approximately the same as the lateral size of the carrier 3. In FIG. 12, the integrated device die 2 may have a lateral size or footprint that is smaller than the lateral size or footprint of the spacer 35. The lateral size or footprint of the spacer 35 may be smaller than the lateral size or footprint of the carrier 3. In FIG. 13, by contrast, the integrated device die 2 may have a lateral size or footprint that is larger than the lateral size or footprint of the spacer 35 and/or the carrier 3. In FIG. 13, the spacer 35 is illustrated as being about the same lateral size or footprint as the carrier 3, but in other embodiments, the spacer 35 may have a smaller lateral size than the carrier 3. Still other combinations of lateral size and/or footprint of the die 2, the spacer 35, and the carrier 3 may be suitable for the embodiments disclosed herein. As with the embodiment of FIGS. 9A-9B, each of the embodiments of FIGS. 10A-13 may reduce the risk of electrical shorting or arcing and reduce the overall stresses of the package 1.

Figure 14:
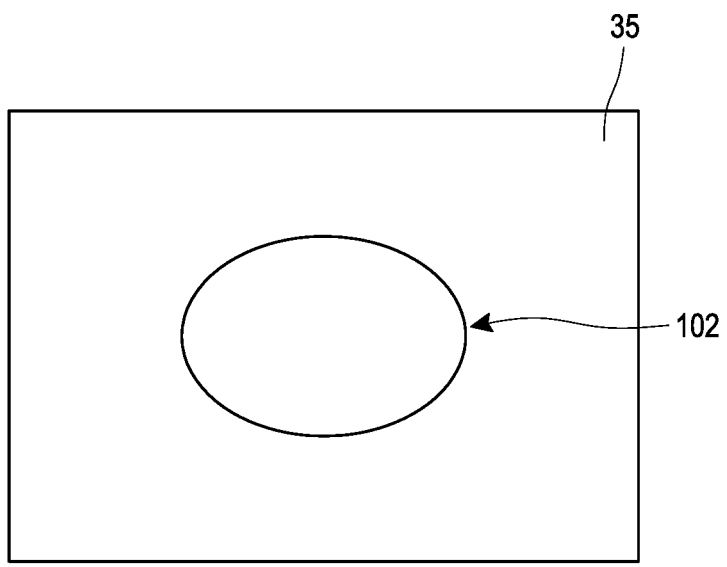
FIG. 14 is a schematic top view of a spacer according to an embodiment.

FIG. 14 is a schematic top view of a spacer 35 according to an embodiment. The spacer 35 of FIG. 14 may be implemented in any of the packages 1 disclosed herein. The spacer 35 illustrated in FIG. 14 includes an opening 102. The opening 102 can enable the use of functionality for other integrated circuit and/or packaging applications. The opening 102 may be pattered or formed as desired for the specific application. For example, the opening 102 may comprise a hole through a portion of the spacer 25 as illustrated in FIG. 14, or comprise a cavity formed partially through a portion of the spacer 25. In some embodiments, an insert (e.g., an optical insert such as a lens or a filter) may be disposed within the opening 102. For example, the insert may enable optical communication through the spacer 35 between the die 2 and the carrier 3, or between other stacked components between which the spacer 35 is disposed.

Figure 15:
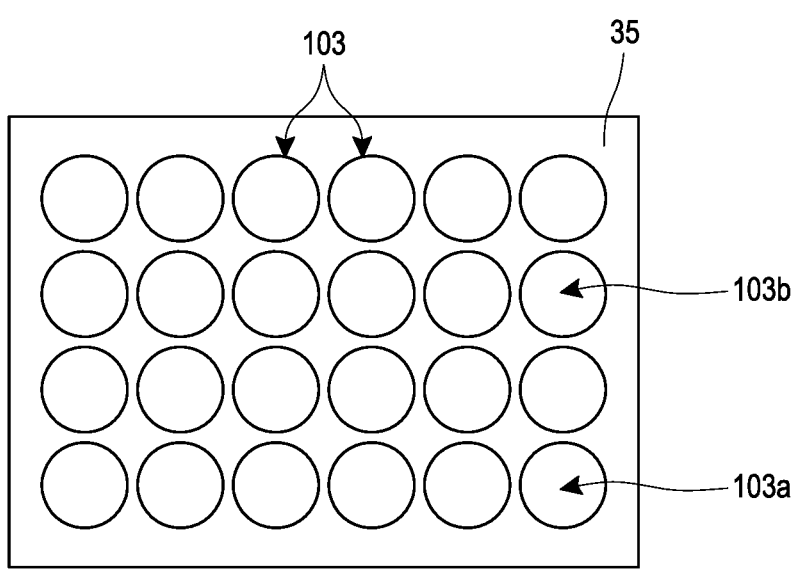
FIG. 15 is a schematic top view of a spacer according to another embodiment.

FIG. 15 is a schematic top view of a spacer 35 according to another embodiment. The spacer 35 of FIG. 15 may be implemented in any of the packages 1 disclosed herein. The spacer 35 illustrated in FIG. 15 includes a plurality of openings 103. The openings 103 may be filled with a filler material or inserts (e.g., lens or filters). The openings 103 can be vertically integrated in the system so as to provide optical or electrical communication between the die 2 and the carrier 3. The filler material can be, for example, an epoxy, such as SU-8. In some embodiments, the spacer 35 can be modified by, for example, using a laser to modify the property of the filler material. For example, SU-8 filler material can be modified to allow/prohibit light to pass therethrough. There are twenty-four (24) openings 103 equally spaced from one another in FIG. 15. However, the spacer 35 may comprise any number of openings 103 with suitable spacings between the openings 103. The openings 103 may have any suitable shape and/or size. Further, different openings 103a, 103b of the openings 103 can include different filler materials and/or inserts. For example, one or more first openings 103a can include a first type of filler material or insert, and one or more second openings 103b can include a second type of filler material or insert. Beneficially, the use of different filler materials or inserts in different regions of the spacer 35 (e.g., in different openings 103a, 103b) can enable different functionalities across the spacer 35. Different materials/inserts can be incorporated within the same space, enabling (for example) light of different wavelengths to transmit through different portions of the same spacer/substrate—therefore though the different planes of the vertically integrated structure linking up different components within the system.

Figure 16:
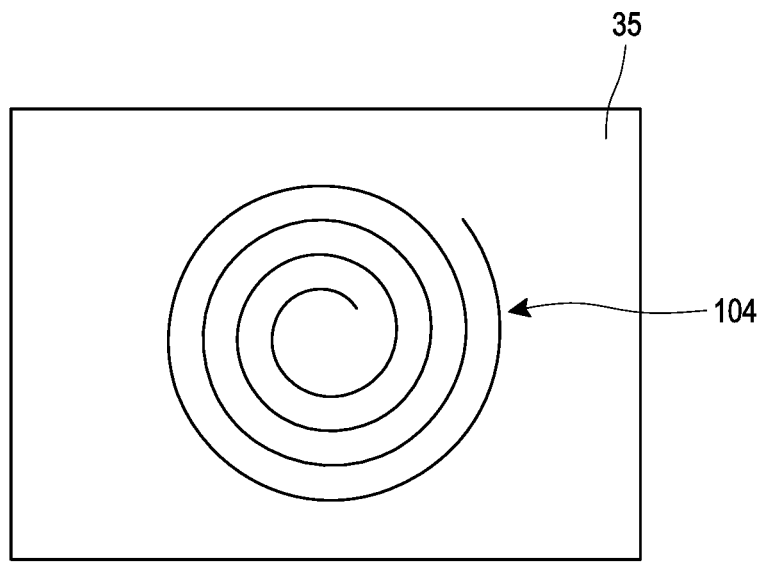
FIG. 16 is a schematic top view of a spacer according to another embodiment.

FIG. 16 is a schematic top view of a spacer 35 according to another embodiment. The spacer 35 of FIG. 16 may be implemented with any of the packages 1 disclosed herein. The spacer 35 illustrated in FIG. 16 includes a pattern of material 104. The patterned material 104 may be dispensed on and/or embedded into the spacer 35. The pattern of material 104 can comprise a metallic pattern, conductive pattern, insulator pattern, etc. In the illustrated embodiment, the patterned material 104 can comprise a spiral or curved pattern. In some embodiments, the patterned material 104 may be beneficial for use with magnetic sensor or magnetic switch applications. In some embodiments, the patterned material 104 may be used as a band pass filter. In still other embodiments, the patterned material 104 may be used in conjunction with packages that harvest energy by, for example, harnessing vibration, light, and/or heat to collect and store energy for other uses.

Figure 17:
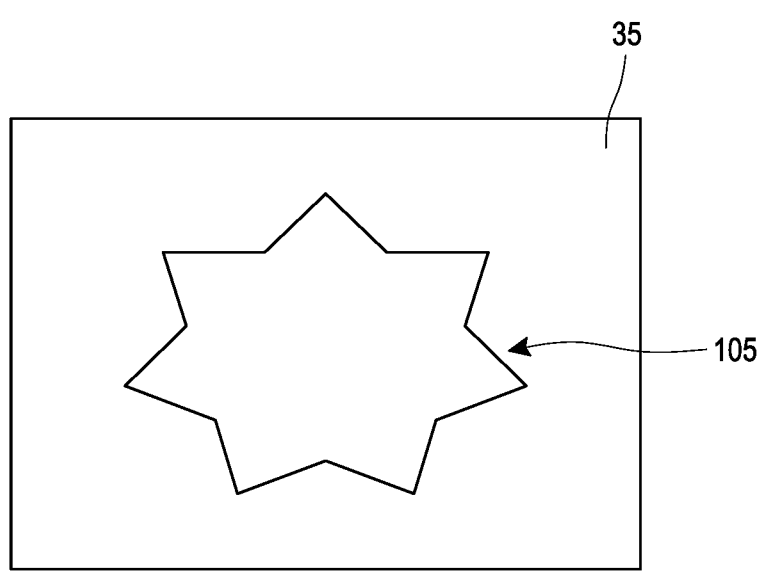
FIG. 17 is a schematic top view of a spacer according to another embodiment.

FIG. 17 is a schematic top view of a spacer 35 according to another embodiment. The spacer 35 of FIG. 17 may be implemented with any of the packages 1 disclosed herein. The spacer 35 illustrated in FIG. 17 includes an optical filter 105 formed through at least a portion of a thickness of the spacer 35. The filter 105 may be disposed on or into the thickness of the spacer 35, and can be configured to pass or attenuate light at selected optical frequency ranges. The spacer 35 illustrated in FIG. 17 may be beneficial for use with biomedical applications and/or optical applications, in some embodiments. The filter 105 may comprise a wavelength filter, band pass filter, etc.

Figure 18:
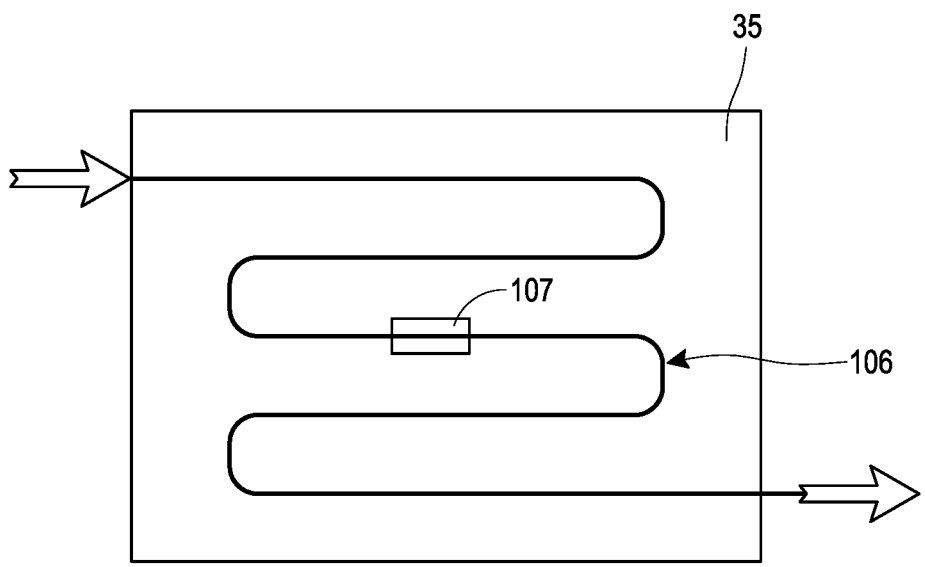
FIG. 18 is a schematic top view of a spacer according to another embodiment.

FIG. 18 is a schematic top view of a spacer 35 according to another embodiment. The spacer 35 of FIG. 18 may be implemented with any of the packages 1 disclosed herein. The spacer 35 illustrated in FIG. 18 can be used in fluidic applications, and can includes a fluid pathway 106 patterned or otherwise defined in the spacer 35. The fluid pathway 106 may be disposed on or into the spacer 35. The fluid pathway 106 can comprise a channel, a via, a track, a microfluidic channel, etc. for conveying fluid through the spacer 35. Fluid can be driven through the fluid pathway 106 along a lateral direction of the spacer 35 (as shown in FIG. 18) or vertically through the spacer 35. The spacer 35 can also include a valve 107 along the fluid pathway 106. The valve 107 can be configured to control a flowrate of fluid along the fluid pathway 106. In various embodiments, the valve 107 can comprise a piezoelectric material. The spacer 35 with the fluid pathway 106 may be used in various types of fluidic applications, including, e.g., a pH sensor, a blood sensor, medical fluids therapy, pharmaceutical tests and devices, food industry tests and devices, polymeric chain reaction (PCR) devices, etc. The fluid pathway 106 may be suitably patterned for the desired application.

Alternatively, in some embodiments, the valve 107 may not be incorporated in the spacer 35. In such embodiments, fluid may flow through the spacer 35 and/or between the spacer 35 and an adjacent layer in the package, without being controlled by the valve 107. The fluid pathway 106 (e.g., a microfluidic channel) can be used to remove heat from the package, in some embodiments. The fluid pathway 106 can interact with the fluid flowing through the spacer and other layers, in some embodiments. For example, one of the layers in a package (e.g., a layer integrated above or below the spacer 35) may monitor the temperature of the fluid and/or extrapolate some other property of the fluid (e.g., magnetic structures detecting some magnetic property, flow rate, and/or an optical property of the fluid). In some embodiments, the valve 107 can include an optical component (e.g., an optical sensor) to detect an optical property of the fluid.

Figure 19:
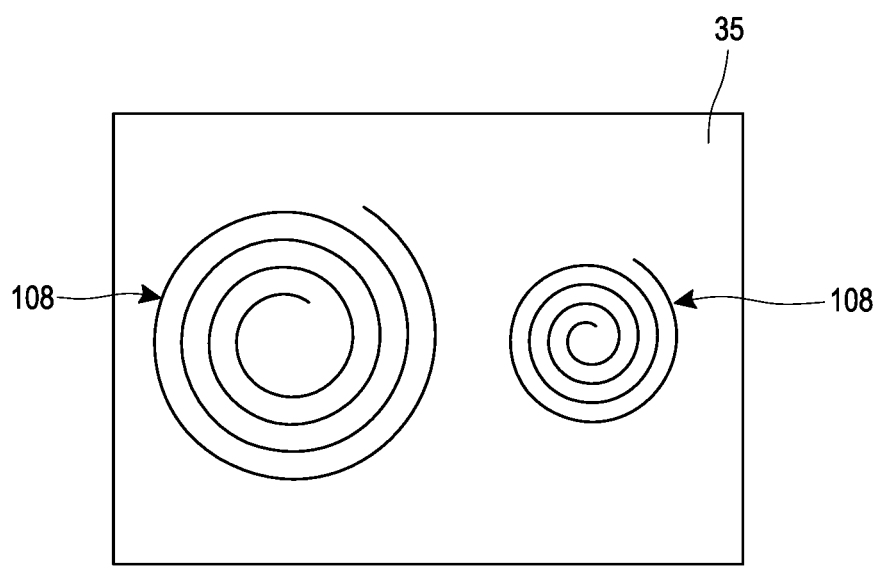
FIG. 19 is a schematic top view of a spacer according to another embodiment.

FIG. 19 is a schematic top view of a spacer 35 according to another embodiment. The spacer 35 of FIG. 19 may be implemented with any of the packages 1 disclosed herein. The spacer 35 illustrated in FIG. 19 includes a sensor 108. The sensor 108 may be disposed on or into the spacer 35. In some embodiments, the sensor 108 can comprise a radio frequency identification (RFID) device. The sensor 108 may enable a wireless communication between the package 1 and an external device, or between device dies within the package 1. The sensor 108 may enable the package for use with an internet of things (IoT) system by wirelessly receiving and/or transmitting information to external devices. The sensor 108 may also provide data encryption capabilities for the package 1.

FIG. 20 is a schematic top view of a spacer 35 according to another embodiment. The spacer 35 of FIG. 20 may be implemented with any of the packages 1 disclosed herein. The spacer 35 illustrated in FIG. 20 includes a patterned void 109. The patterned void 109 may be formed on or into the spacer 35. The void 109 may comprise, for example, a trench 110 or a channel 111 as illustrated in FIGS. 21A and 22A, respectively. The spacer 35 with the patterned profile can be beneficial for use a band pass filter, which can filter light of various wavelengths. The spacer 35 can comprise silicon, polymer, or any suitable material.

FIG. 21A is a side view of the spacer 35 that includes a plurality of trenches 110 according to an embodiment. The spacer 35 of FIG. 21A may be implemented with any of the packages 1 disclosed herein. The trenches 110 may be formed (e.g., etched) into a portion of a thickness of the spacer 35. The trenches 110 may be suitably spaced from one another, for example, to provide optical filtering functionality at desired wavelength ranges. The trenches 110 may be configured to enable media to traverse laterally and/or vertically through layers of a package. Also, the spacer 35 and/or any layer(s) of the package can be connected to an external system and/or component. For example, a specific layer of the package can communicate with an external optical network or the fluid to be analyzed and/or modified can ingress from, for example, the external environment.

FIG. 21B is a schematic side sectional view of an integrated device package 1 that includes the spacer 35 of FIG. 21A. The carrier 3 of package 1 is mounted to a package substrate. The package 1 of FIG. 21B comprises a leadframe substrate having a die pad 32 electrically spaced from a plurality of leads 34. The package 1 of FIG. 21B illustrates a integrated device die 2 mounted to a carrier 3 (another integrated device die) by way of a multi-layer mounting structure 15 that comprises the spacer 35. As with FIGS. 4B and/or 5B, the multi-layer mounting structure 15 illustrated in FIG. 21B includes a first insulating adhesive layer 4a between the carrier 3 and the spacer 35, and a third insulating adhesive layer 4b between the die 2 and the spacer 35. However, it should be appreciated that the die 2 can instead be mounted to the carrier 3 by way of the multi-layer mounting structure 15 that comprises any number of insulating adhesion layer(s). The carrier 3 can be mounted to the die pad 32 by way of a suitable die attach material 33. In FIG. 21B, first bonding wires 5a can electrically connect the carrier 3 to the leads 34. Second bonding wires 5b can electrically connect the die 2 to the leads 34. In other embodiments, the die 2 can be flip chip mounted to the carrier 3. In some embodiments, a molding compound or encapsulant (for example, the encapsulant 31 of FIG. 7) can be provided over upper surfaces of the die pad 32 and leads 34, over the bonding wires 5a, 5b, and over the stacked die 2 and carrier 3. The leadframe substrate (e.g., the leads 34 and die pad 32) can be mounted to a system board or motherboard to connect the package to the larger electronic device or system.

FIG. 22A is a side view of the spacer 35 that includes a plurality of channels 111 according to an embodiment. The spacer 35 of FIG. 22A may be implemented with any of the packages 1 disclosed herein. As shown in FIG. 22B, the channels 111 can comprise channels disposed laterally through the spacer 35, e.g., parallel to major surfaces of the spacer 35. In other embodiments, the channels 111 can comprise discrete voids or spaces within the spacer 35. As with FIG. 21A, the size and spacing of the channels 111 can be selected to provide optical filtering or other suitable types of functionality.

FIG. 22B is a schematic side sectional view of an integrated device package 1 that includes the spacer 35 of FIG. 22A. The carrier 3 of package 1 is mounted to a package substrate. The package 1 of FIG. 22B comprises a leadframe substrate having a die pad 32 electrically spaced from a plurality of leads 34. The package 1 of FIG. 22B illustrates an integrated device die 2 mounted to a carrier 3 (another integrated device die) by way of a multi-layer mounting structure 15 that comprises the spacer 35. As with FIGS. 4B and/or 5B, the multi-layer mounting structure 15 illustrated in FIG. 22B includes a first insulating adhesive layer 4a between the carrier 3 and the spacer 35, and a third insulating adhesive layer 4b between the die 2 and the spacer 35. However, it should be appreciated that the die 2 can instead be mounted to the carrier 3 by way of the multi-layer mounting structure 15 that comprises any number of insulating adhesion layer(s). The carrier 3 can be mounted to the die pad 32 by way of a suitable die attach material 33. In FIG. 22B, first bonding wires 5a can electrically connect the carrier 3 to the leads 34. Second bonding wires 5b can electrically connect the die 2 to the leads 34. In other embodiments, the die 2 can be flip chip mounted to the carrier 3. In some embodiments, a molding compound or encapsulant (for example, the encapsulant 31 of FIG. 7) can be provided over upper surfaces of the die pad 32 and leads 34, over the bonding wires 5a, 5b, and over the stacked die 2 and carrier 3. The leadframe substrate (e.g., the leads 34 and die pad 32) can be mounted to a system board or motherboard to connect the package to the larger electronic device or system.

The channels 111 may be constructed to enable fluid and/or optical signals to travel along the spacer 35, in some embodiments. The trenches 111 may be configured to enable media to traverse laterally and/or vertically through layers of the package 1. Also, the spacer 35 and/or any layer(s) of the package 1 can be connected to an external system and/or component. For example, a specific layer of the package 1 can communicate with an external optical network. For example, a microfluidic channel that is included in the package 1 (e.g., within the stacked module/vertically integrated system) can also be connected to an external environment.

FIG. 23A is a schematic side sectional view of an integrated device package 1 according to another embodiment. The carrier 3 of the package 1 is mounted to a package substrate. The package 1 of FIG. 23A comprises a leadframe substrate having a die pad 32 electrically spaced from a plurality of leads 34. In other embodiments, the package substrate can comprise a laminate substrate. The package 1 of FIG. 23A illustrates a integrated device die 2 mounted to a carrier 3 (another integrated device die) by way of a multi-layer mounting structure 15 that comprises the spacer 35.

As with FIGS. 4B and/or 5B, the multi-layer mounting structure 15 illustrated in FIG. 23A includes a first insulating adhesive layer 4a between the carrier 3 and the spacer 35, and a third insulating adhesive layer 4b between the die 2 and the spacer 35. However, it should be appreciated that the die 2 can instead be mounted to the carrier 3 by way of the multi-layer mounting structure 15 that comprises any number of insulating adhesion layer(s).

The spacer 35 illustrated in FIG. 23A includes a pathway 112 disposed laterally along or within the spacer 35. The pathway 112 can comprise any suitable type of pathway, such as a fluidic pathway, a microfluidic pathway, an optical pathway, or an electronic pathway. The pathway 112 can accordingly provide fluid, optical, and/or electronic communication along a lateral direction parallel to and between the die 2 and the carrier 3, for example, between input terminal 116a and output terminal 116b. As explained herein, in optical applications, the pathway 112 can comprise a fluid piping tube or channel.

The carrier 3 can be mounted to the die pad 32 by way of a suitable die attach material 33. In some embodiments, as illustrated in FIG. 23A, a molding compound or encapsulant 31 can be provided over upper surfaces of the die pad 32 and leads 34, over the stacked die 2 and carrier 3, and over upper and lower surfaces of the spacer 35. Thus, in FIG. 23A, the spacer 35 can be disposed between portions of the encapsulant 31. The leadframe substrate (e.g., the leads 34 and die pad 32) can be mounted to a system board or motherboard to connect the package to the larger electronic device or system. Although FIG. 23A does not illustrate bonding wires, it should be appreciated that, as explained above, bonding wires can be provided within the layer 4a to connect the carrier 3 to the leads 34. The spacer 35 can serve to isolate the bonding wires from other components of the package 1.

The pathway 112 (e.g., a microfluidic channel) can be used to remove heat from the package 1, in some embodiments. The pathway 116 can interact with the fluid flowing through the spacer and other layers, in some embodiments. For example, one of the layers in a package (e.g., a layer integrated above or below the spacer 35) can monitor the temperature of the fluid and/or extrapolate some other property of the fluid (e.g., magnetic structures detecting some magnetic property, flow rate, an optical property of the fluid flowing through etc.).

FIGS. 23B-23D illustrate schematic side sectional views of various embodiments of a spacer 35 having a pathway 112. The spacer 35 illustrated in FIG. 23B includes a pathway 112 that comprises a fiber optic channel 113. In FIG. 23B, therefore, the pathway 112 of the spacer 35 can be used to enable optical communication laterally through the spacer 35 along the fiber optic channel 113. The spacer 35 illustrated in FIG. 23C includes a pathway 112 having a tapered channel 114, which may be used with fluidic applications, for example. In FIG. 23C, fluid can be driven through the tapered channel 114 laterally along the spacer 35. The spacer 35 illustrated in FIG. 23D includes the tapered channel 114 with fluidic device 115 (e.g., a filter or pump) disposed in or along the tapered channel 114. The fluidic device 115 can interact with the fluid to filter materials from the fluid or to drive the liquid through the pathway 112. For FIGS. 23A-23D, the spacer 35 can connect to external networks or devices by way of the terminals 16a, 16b to provide optical, electrical, or fluidic communication with those external networks or devices.

FIG. 23E illustrates a schematic top view of the package 1 of FIG. 23A. In FIG. 23E, first bonding wires 5a can electrically connect the carrier 3 to the leads 34. Second bonding wires 5b can electrically connect the die 2 to the leads 34. In other embodiments, the die 2 can be flip chip mounted to the carrier 3. As explained above, the spacer 35 can be provided over the bonding wires so as to prevent shorting.

Figure 24:
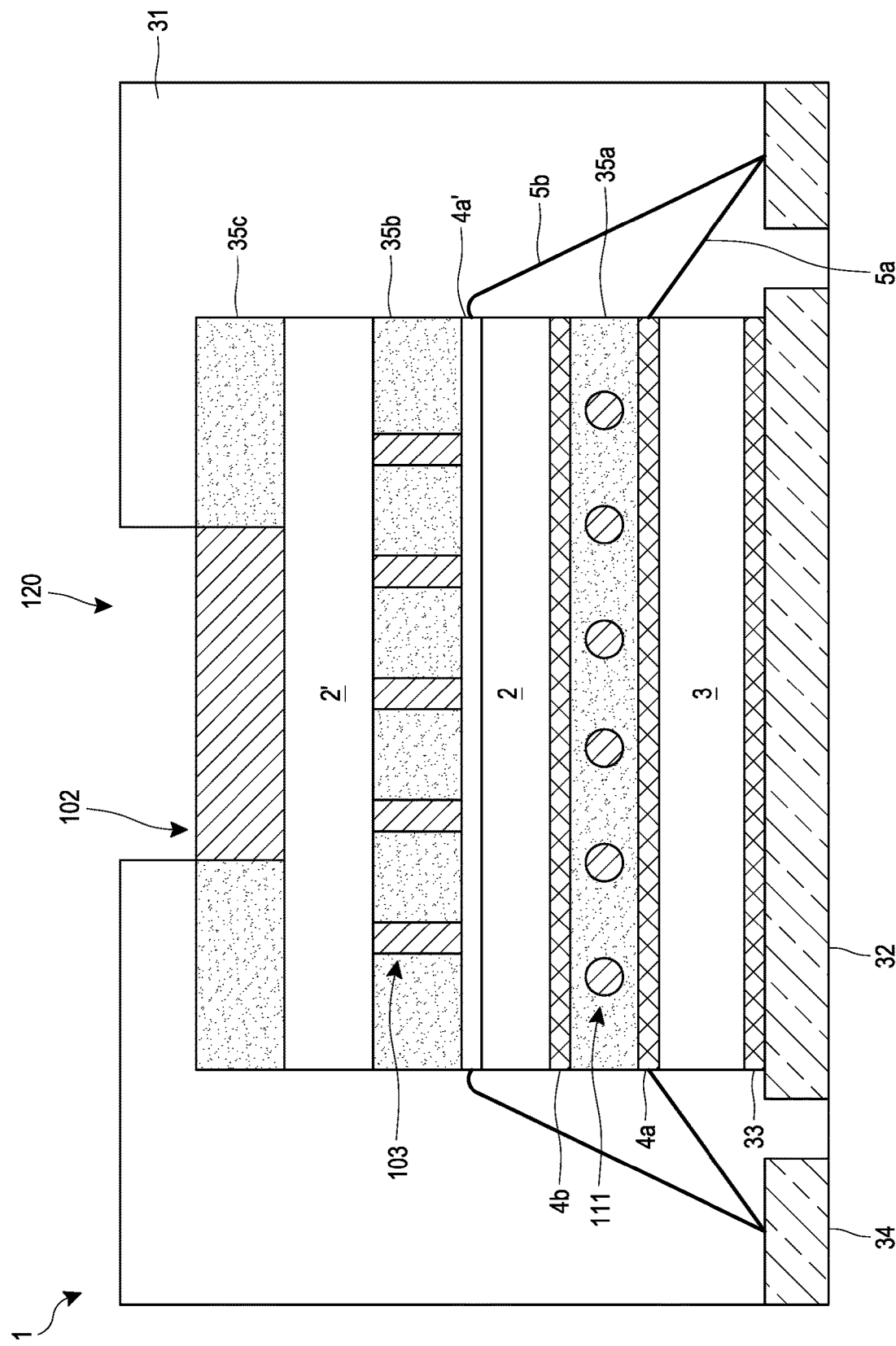
FIG. 24 is a schematic side sectional view of an integrated device package 1 that includes two integrated device dies and a carrier stacked vertically.

FIG. 24 is a schematic side sectional view of an integrated device package 1 that includes two integrated device dies 2, 2', and a carrier 3 stacked vertically. The carrier 3 is mounted to a die pad 32 by way of an adhesive 33, and the carrier 3 is electrically connected to leads 34 by way of bonding wires 5a.

A multi-layer mounting structure 15 includes a spacer 35a, a first insulating adhesive layer 4a between the carrier 3 and the spacer 35a, and a third insulating adhesive layer 4b between the die 2 and the spacer 35a. The spacer 35a illustrated in FIG. 24 can be the same or generally similar to the spacer 35 illustrated in FIG. 22A. For example, lateral channels 111 can be provided through the spacer 35a. In various embodiments, the channels 111 can provide optical, electrical, or fluidic pathways through the spacer 35a.

The two integrated device dies 2, 2' are spaced from one another by a spacer 35b that includes a plurality of openings 103. The spacer 35b illustrated in FIG. 24 can be the same or generally similar to the spacer 35 illustrated in FIG. 15. The openings 103 can be filled or unfilled with a filler material. In some embodiments, the openings 103 can comprise vertical vias, optical pathways, etc. As illustrated, there can be an adhesive layer 4a' between the spacer 35b and the integrated device die 2. In some embodiments, the two dies 2, 2' can electrically, optically, and/or fluidly communicate through the openings 103. The integrated device die 2 illustrated in FIG. 24 is electrically connected to the leads 34 by way of bonding wires 5b.

A spacer 35c that can be the same or generally similar to the spacer 35 illustrated in FIG. 14 is disposed over the integrated device die 2'. The spacer 35c can include an opening 102. The opening can be filled or unfilled with a filling material. The opening 102 can comprise a via, an optical path, etc. The opening 102 can be larger than the opening 103, in some embodiments.

A molding compound or encapsulant 31 can be provided about the stacked spacers 35a-35c, dies 2, 2', and carrier 3. The encapsulant 31 can have an opening 120 over the opening 102 of the spacer 35c. In some embodiments, there may be no encapsulant 31 over the spacer 35c. In certain applications, the opening 120 and the opening 102 can allow the integrated device die 2' to communicate with outside environs and/or another device, for example, optically and/or fluidly. The integrated device package 1 illustrated in FIG. 24 may be suitable for fiber optic communications. The spacers 35a, 35b, 35c can comprise any other suitable structures, such as those illustrated in FIGS. 14-20, for the use of the integrated device package 1.

FIG. 25A illustrates a schematic side sectional view of a laminate substrate 122. The laminate substrate 122 includes a plurality of alternating patterned conductive and non-conductive layers. In various embodiments, the laminate substrate 122 can comprise a printed circuit board (PCB) substrate. Further, in FIG. 25A, the laminate substrate 122 can include various electronic components therein. The laminate substrate 122 can include vias, lens, filters, modified areas, voids, cavities, etc. FIG. 25A shows interconnection terminals 124a, 124b (such as fluid and/or fiber optic connections) coupled to openings 126a, 126b. A terminal 124a, 124b and/or an opening 126a, 126b may be provided to any spacer disclosed herein. The laminate substrate can communicate (e.g., receive an input or transmit an output), for example, electrically, fluidly, and/or optically, with the outside environment and/or an external system or a device.

FIG. 25B illustrates a schematic side sectional view of the laminate substrate 122 that is mounted on a carrier 128. The carrier 128 has a top side or a back side 128a and a bottom side or a front side 128b. The front side can comprise an active surface. The carrier 128 can include vias 130 extending from the back side 128b to the front side 128b. As illustrated in FIG. 25B, the front side 128b of the carrier can have solder balls 132 to provide electrical communication between the vias 130 and an external device. The laminate substrate 122 and the carrier 128 can be in electrical connection. In some embodiments, the carrier 128 can comprise an application specific integrated circuit (ASIC) with through substrate vias TSVs. For example, active circuitry of the ASIC can control or manage functions of the laminate substrate 122.

FIG. 25C illustrate a schematic side sectional view of an integrated device package 1 that includes the laminate substrate 122 and the carrier 128 of FIG. 25B, according to an embodiment. The integrated device package 1 has a generally similar structure as the integrated device package 1 illustrated in FIG. 10A except that the package 1 of FIG. 25C includes the laminate substrate 122 and the carrier 128 and a molding compound or encapsulant 31. The solder balls 132 of the carrier 128 can electrically connect to corresponding contact pads on the die 2. As shown, the carrier laminate substrate 122 can be exposed through, and positioned above, the encapsulant 31. Additional devices or dies (not shown) can electrically connect to the top surface of the substrate 122.

FIG. 25D illustrate a schematic side sectional view of an integrated device package 1 that includes the laminate substrate 122 and the carrier 128 of FIG. 25B, according to an embodiment. The package 1 illustrated in FIG. 25D is generally similar to the package 1 illustrated in FIG. 25C except that the encapsulant 31 in FIG. 25D covers side walls of the laminate substrate 122.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An integrated device package comprising:
a carrier electrically connected to a package substrate;
an integrated device die having a front side and a back side; and
a mounting structure that serves to mount the back side of the integrated device die to the carrier, the mounting structure comprising a first adhesive layer over the carrier and a second element between the back side of the integrated device die and the first adhesive layer,
wherein the first adhesive layer comprises a first insulating material that adheres to the carrier,
wherein the second element comprises a second insulating material that electrically separates the integrated device die from an electrical interconnect connected to the carrier, the electrical interconnect comprises a bonding wire connecting the carrier and the package substrate, a portion of the bonding wire is disposed between the second element and the carrier, the portion of the bonding wire being embedded within the first adhesive layer, and
wherein the second element comprises a spacer attached to the first adhesive layer, the spacer including a pathway to provide communication between an input terminal and an output terminal of the spacer.

2. The integrated device package of claim 1, wherein the carrier comprises a second integrated device die.

3. The integrated device package of claim 1, wherein the pathway is configured to communicate with an external system or component that is external to the integrated device package.

4. The integrated device package of claim 1, wherein the bonding wire does not protrude into the second element, and the second element physically and electrically isolates the bonding wire from the back side of the integrated device die.

5. The integrated device package of claim 1, wherein the carrier comprises a package substrate, the package substrate comprises a leadframe substrate or a laminate substrate.

6. The integrated device package of claim 1, wherein the first adhesive layer comprises a die attach film (DAF) or an epoxy paste, the first adhesive layer directly contacts the carrier.

7. The integrated device package of claim 1, wherein the second element comprises a solid coating applied over the back side of the integrated device die.

8. The integrated device package of claim 1, wherein the pathway of the spacer comprises an insert, a lens, a filter, a microfluidic channel, a sensor, a void, or a trench.

9. The integrated device package of claim 1, wherein a coefficient of thermal expansion (CTE) of the spacer is within at least +/−90% of one or more of a coefficient of expansion of the integrated device die and a coefficient of thermal expansion of the carrier.

10. The integrated device package of claim 1, wherein the mounting structure comprises a third layer between the back side of the integrated device die and the second element such that the second element is embedded between the first adhesive layer and the third layer, the third layer comprising a third insulating material.

11. The integrated device package of claim 1, wherein one or both of the first adhesive layer and the second element comprises a polymer.

12. A multi-layer mounting tape for attaching an integrated device die to a carrier and electrically isolating a back side of the integrated device die from the carrier, the multi-layer mounting tape comprising:
a first layer comprising a first insulating material having a first flowable state and a second hardened state;
a second layer over the first layer, the second layer comprising a second insulating material, the second layer comprising a means for electrical, optical, fluidic, magnetic, or wireless communication between an input terminal and an output terminal of the second layer, the means for communication configured to communicate with an external system or component that is external to the integrated device package; and
a third layer over the second layer, such that the second layer is embedded between the first layer and the third layer, the third layer comprising a third insulating material, the third insulating material having a first flowable state and a second hardened state.

13. The multi-layer mounting tape of claim 12, wherein the first and third layers each comprise a die attach film (DAF).

14. A method of manufacturing the integrated device package of claim 1, the method comprising:
mounting the back side of the integrated device die to the carrier by way of the mounting structure,
wherein the second element comprises a second insulating material that electrically separates the integrated device die from the carrier and/or from an electrical interconnect connected to the carrier.

15. An integrated device package comprising:
a carrier comprising a pad for receiving a bonding wire;
an integrated device die having a front side and a back side; and
a mounting structure that serves to mount the back side of the integrated device die to the carrier, the mounting structure comprising a first adhesive layer over the carrier and a spacer between the back side of the integrated device die and the first adhesive layer, at least a portion of the first adhesive layer positioned over the pad of the carrier, wherein the spacer includes a pathway, that provides communication between an input terminal and an output terminal of the spacer, the pathway configured to communicate between the carrier and the integrated device die, the pathway configured to communicate with an external system or component that is external to the integrated device package.

16. The integrated device package of claim 15, wherein the pathway extends vertically through the spacer to provide communication between the carrier and the integrated device die.

17. The integrated device package of claim 15, further comprises a second spacer over the integrated device die, the second spacer includes a second pathway, the second pathway providing communication between the integrated device die and the outside environs.

18. The integrated device package of claim 1, wherein the pathway is configured to provide an electrical, optical, fluidic, magnetic, or wireless communication between the input terminal and the output terminal of the spacer.

19. The integrated device package of claim 1, wherein the pathway is configured to provide a fluidic communication between the input terminal and the output terminal of the spacer.

20. The integrated device package of claim 15, wherein the pathway is configured to provide an electrical, optical, fluidic, magnetic, or wireless communication between the input terminal and the output terminal of the spacer.

* * * * *